(12) United States Patent
Higashitani et al.

(10) Patent No.: US 7,161,371 B2
(45) Date of Patent: Jan. 9, 2007

(54) MODULE PART

(75) Inventors: Hiroshi Higashitani, Habikino (JP); Takeo Yasuho, Neyagawa (JP); Masaaki Hayama, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/488,552

(22) PCT Filed: Feb. 19, 2003

(86) PCT No.: PCT/JP03/01785

§ 371 (c)(1),
(2), (4) Date: Mar. 4, 2004

(87) PCT Pub. No.: WO03/071603

PCT Pub. Date: Aug. 28, 2003

(65) Prior Publication Data
US 2005/0017740 A1 Jan. 27, 2005

(30) Foreign Application Priority Data
Feb. 19, 2002 (JP) .............................. 2002-041066

(51) Int. Cl.
G01R 31/02 (2006.01)
(52) U.S. Cl. ..................................... 324/763
(58) Field of Classification Search ................. None
See application file for complete search history.

(56) References Cited

U.S. PATENT DOCUMENTS

| 5,162,540 | A | * | 11/1992 | McGarrity et al. | 548/303.1 |
| 5,703,397 | A | * | 12/1997 | Endo et al. | 257/701 |
| 5,821,762 | A | * | 10/1998 | Hamaguchi et al. | 324/754 |
| 6,588,097 | B1 | * | 7/2003 | Nishide et al. | 29/832 |
| 6,828,670 | B1 | * | 12/2004 | Hayama et al. | 257/700 |
| 6,846,375 | B1 | * | 1/2005 | Hayama et al. | 156/89.16 |
| 6,884,938 | B1 | * | 4/2005 | Aoyagi | 361/790 |
| 2001/0005313 | A1 | | 6/2001 | Muramatsu et al. | 361/768 |
| 2002/0017710 | A1 | | 2/2002 | Kurashima et al. | 257/686 |
| 2005/0104219 | A1 | * | 5/2005 | Matsui | 257/774 |

FOREIGN PATENT DOCUMENTS

| JP | 11-45955 | 2/1999 |
| JP | 2000-182018 | 6/2000 |
| JP | 2001-210954 | 8/2001 |
| JP | 2001-267490 | 9/2001 |

\* cited by examiner

*Primary Examiner*—Jermele Hollington
(74) *Attorney, Agent, or Firm*—Steptoe & Johnson LLP

(57) ABSTRACT

A module component which includes circuit substrate 3 having one or more components 1 on at least one of the surfaces, and junction circuit substrate 5 having hollow 4, or hole, disposed corresponding to the portion of the one or more components 1 mounted on the one surface of circuit substrate 3 for fitting the mounted components 1 in. These substrates are laminated to form a single body so that mounted components 1 is contained within the inside. The above configuration ensures high reliability in the layer-to-layer connection, and enables to mount a plurality of components densely with a high dimensional accuracy. Thus a highly reliable compact module component is offered.

68 Claims, 18 Drawing Sheets

MODULE PART

This application is the U.S. National stage of international application PCT/JP03/01785, filed Feb. 19, 2003.

TECHNICAL FIELD

The present invention relates to a module component for use in electronic apparatus, communication equipment, etc.

BACKGROUND ART

In the prevailing down-size trends in the electronic apparatus industry, the multi-layered circuit boards are requested to be smaller in size and thinner, at the same time to be more precise in the dimensional accuracy. Japanese Patent Laid-Open Application No. H11-45955 discloses a small-size wiring board which contains semiconductor devices and electronic components (capacitors, resistors, filters, oscillation elements, etc.) within the inside. The above-described conventional wiring board is formed of a thermosetting resin and a composite material containing a thermosetting resin as the main ingredient. The constituent substrates are laminated while respective substrates are in the soft state (uncured- or half-cured state). They are cured all at once after being laminated. Since respective substrates are still to be cured at the stage when they are laminated, they are easily affected by the influence of forthcoming thermal expansion/shrinkage during curing process. Namely, reliability in the connection between internal electrodes tends to be poor. Furthermore, it is not easy to eliminate an air gap around the built-in components, which air gap can be generated as a result of dimensional change among the constituent substrates. This means that the reliability can be deteriorated also by humidity in the air. The present invention aims to reduce the dimensional shift due to the high temperature, which dimensional shift arising out of the process for curing a laminated body. Thereby, a high reliability in the connection among the laminated layers may be secured. Also aimed by the present invention is to offer a small module component in which a plurality of components is built-in precisely and densely.

DISCLOSURE OF INVENTION

The present invention offers a module component which includes one or more mounting components, a circuit substrate having the component mounted on at least one of the surfaces, and a junction circuit substrate having either a hollow or a hole at the place corresponding to the component mounted on one of the surfaces of circuit substrate for fitting the mounted component in. The junction circuit substrate is provided with a connection function. The circuit substrate and the junction circuit substrate are laminated into a single body and then cured so that the mounted component is contained therein.

Other module component in the present invention includes one or more mounting components, one circuit substrate having the component mounted on at least one of the surfaces, another circuit substrate having the component mounted on at least one of the surfaces, and a junction circuit substrate disposed between the circuit substrates, which junction circuit substrate having either a hollow or a hole at the places corresponding to respective components mounted on the opposing surfaces of the circuit substrates for fitting the mounted components in. The junction circuit substrate is provided with a connection function. The circuit substrates and the junction circuit substrate are laminated to form a single body and then cured so that the mounted components are contained therein.

Still other module component in the present invention includes one or more mounting components, a circuit substrate having the component mounted on at least one of the surfaces, and one junction circuit substrate having either a hollow or a hole at the place corresponding to the one or more components mounted on the circuit substrate for fitting the component in. The junction circuit substrate is provided with a connection function. The circuit substrate is sandwiched between the one junction circuit substrate and another junction circuit substrate to be laminated into a single body, and then it is cured so that the component is contained therein.

DETAILED DESCRIPTION OF PREFERRED EMBODIMENTS

Figure 1:
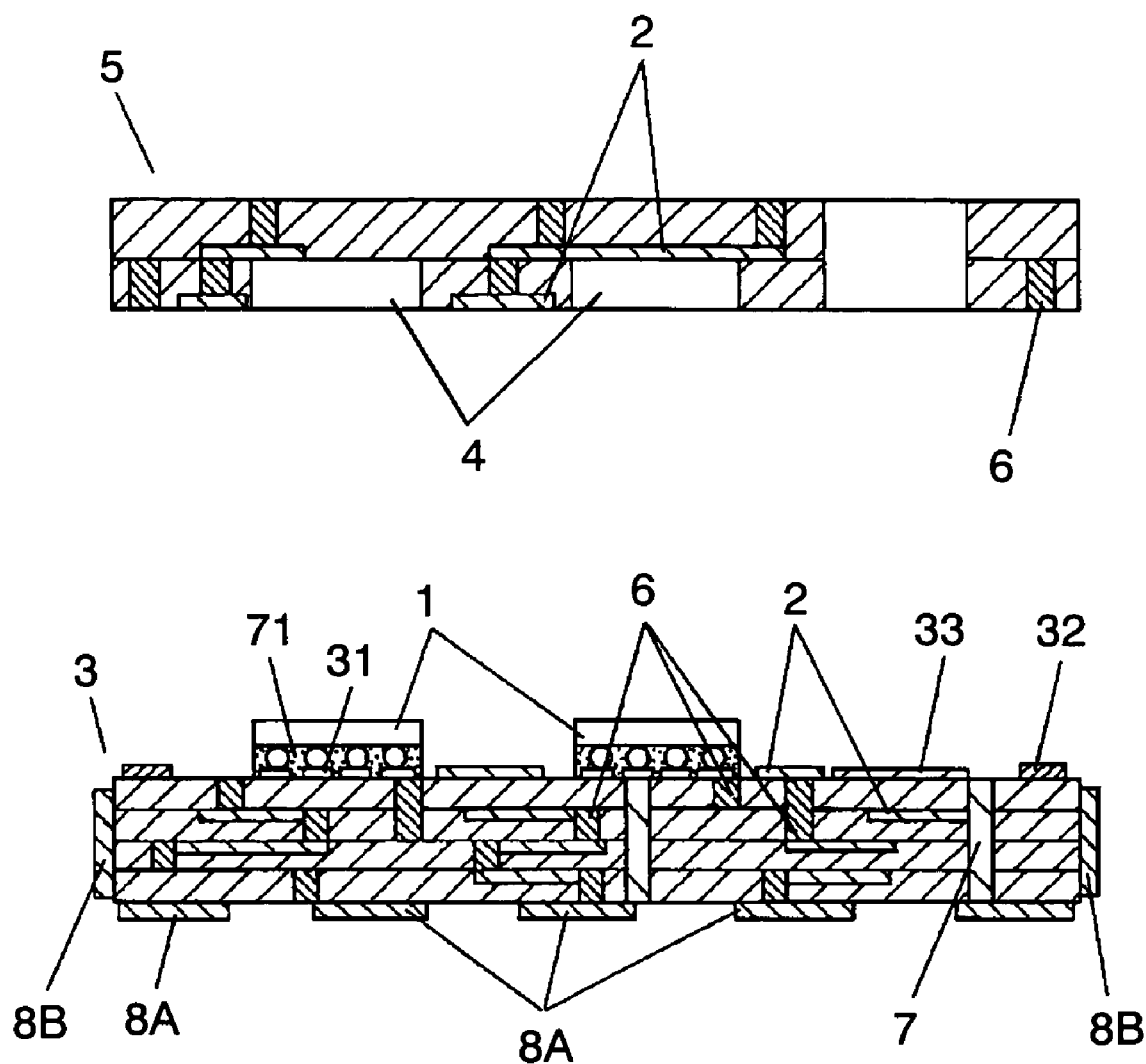
FIG. 1 shows the cross sectional views of a separated module component in accordance with a first exemplary embodiment of the present invention.

Module components in accordance with exemplary embodiments of the present invention are described in the following referring to the drawings. The drawings are intended to exhibit the concepts of the present invention; they do not represent precise dimensional status.

(FIRST EXEMPLARY EMBODIMENT)

A module component is described in accordance with a first exemplary embodiment of the present invention, referring to FIG. 1. The module component includes circuit substrate 3, a plurality of components 1 mounted on connection terminals 31 provided on one of the main surfaces of circuit substrate 3, and junction circuit substrate 5 having hollow 4 for fitting the mounted components 1 in. The junction circuit substrate is provided with a function of connecting both electrically and mechanically with circuit substrate 3. Circuit substrate 3 has wiring pattern 2, via 6 and through hole 7. Circuit substrate 3 is formed in the multilayered wiring structure; two or more number of layers. Circuit substrate 3 is further provided on the upper surface with connection terminal 31 and connection terminal 32. Connection terminal 31 is for the connection with mounted component 1. Connection terminal 32 is for the electrical connection with via 6 of junction circuit substrate 5. The electric circuit in a module component is thus structured. Circuit substrate 3 is further provided with external connection terminals, 8A and 8B, for electrically connecting an individual module component with a mother board. Terminal 8A is provided in the LGA (Land Grid Array) arrangement, where a number of terminal electrodes are formed on the lower surface of circuit substrate 3. Terminal 8B is provided as an end-face electrode, which is formed on the side face of circuit substrate 3. Circuit pattern 2 on the upper surface of circuit substrate 3 is additionally provided with constant adjustment pattern 33, which pattern playing the following role. In the electrical circuit constituting a module component, e.g., in the analog circuit, the final electrical characteristics are sometimes optimized by adjusting the circuit constant of the circuit at the end stage of the manufacturing. It is not an easy job to adjust the electrical characteristics of circuit after component 1 is mounted within the inside. The circuit constant adjustment function is added to circuit pattern 2 for meeting the above-described needs. Rectangular chip resistors, capacitors, inductors, EMC countermeasure components or the like passive components are mounted as component 1 on circuit substrate 3 by a high speed mounting facility. At the mounting operation, components 1 hit circuit substrate 3 with a certain force. The total mechanical shocks given to circuit substrate 3 during mounting procedure are substantial.

Therefore, circuit substrate 3 is made of a high rigidity material strong enough to withstand the mechanical shocks. Example of the high-rigidity material includes FR-4, CEM-3 from the organic based materials, and a ceramic substrate, a metal substrate from the inorganic based materials. Furthermore, a cured composite resin substrate formed of a mixture containing inorganic filler and thermosetting resin can also be used.

Components 1 are not limited to the passive components; packaged semiconductor ICs and other kinds of active components may be mounted as component 1. Chip LCRs, CSPs, etc. whose connection terminals are disposed at their bottom and side surfaces, FETs whose connection terminals are disposed at their bottom surface and the upper surface opposing to the bottom surface, and high frequency IC components whose surfaces other than connection terminal areas are covered with electrodes for the sake of heat dissipation or shielding can also be mounted as component 1. Then, circuit substrate 3 is provided with connection terminals 31 compatible with such mounting components.

In the present embodiment 1, components 1 are connected to circuit substrate 3 by means of soldering. A cream solder of Sn—Ag—Cu is applied using a 150 μm thick metal mask on terminal 31 in circuit substrate 3. Component 1 is placed on a predetermined place and connected and fixed by the reflow soldering, keeping the peak temperature 260° C. for 5 seconds and then cooled.

In order to activate the surface of connection terminal 31 and to make the solder connection easy, a soldering flux is used. If the soldering flux remains after the soldering in the connected part, it will lead to a corrosion and connection failure, which leads to a significantly deteriorated reliability. In order to prevent this to happen, the remaining flux component is removed and cleaned using a cleaning agent containing isopropyl alcohol as the main ingredient. However, the residual flux staying in a very small gap of less than 200 μm between circuit substrate 3 and the mounted components 1 such as packaged IC, chip component is difficult to resolve and remove completely by simply immersing it in a cleaning agent. Therefore, an ultrasonic cleaning facility or a high speed fluid cleaner is used for a thorough removal of the flux.

And then, the gap is filled with under-fill resin 71 formed of an epoxy resin and an inorganic filler material. In order to have the gap filled completely, the viscosity of under-fill resin 71 needs to be lowered. So, the entire circuit substrate 3 is heated to approximately 60° C. before applying under-fill resin 71. And then, it is heated at 150° C. for 5 min. for curing. This way of mounting the components eliminates the gap between circuit substrate 3 and mounted component 1, and high connecting reliability is ensured.

Figure 3A:
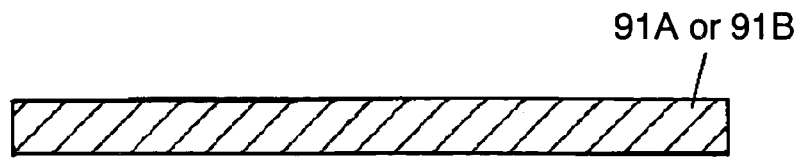
FIG. 3A–FIG. 3F are cross sectional views used to describe a process of manufacturing a junction circuit substrate in accordance with embodiment 1.

Junction circuit substrate 5 is provided with hole 95A and hole 95B. Hole 95A is for fitting component 1 mounted on circuit substrate 3 in. Hole 95B is for fitting a trimmer capacitor or the like adjustment parts in. The capacitance is adjusted after a module component is finished; by trimming constant adjustment pattern 33 with a laser beam, Leutor (hand grinding tool), etc. Junction circuit substrate 5 is made of a thermosetting resin, a thermoplastic resin, etc. Preferred thermosetting resin includes a high heat-withstanding epoxy resin, a phenol resin, and a cyanate resin. The epoxy resin, among other resins, has a significantly high heat-withstanding property; so it is advantageous in preventing the broken connection or short circuiting due to thermal distortion caused in junction circuit substrate 5 by the heat generated from mounted component 1. As to the thermoplastic resin, a highly heat-resistive polyimide, polyether sulfonate, etc. may be used. Next, a laminate sheet forming junction circuit substrate 5 is described. It is provided by forming a material containing thermosetting resin as the main ingredient into a sheet, as shown in FIG. 3A. Laminate sheet 91A, or 91B, is kept in the half-cured state (B stage) to be used as a prepreg.

Figure 2:
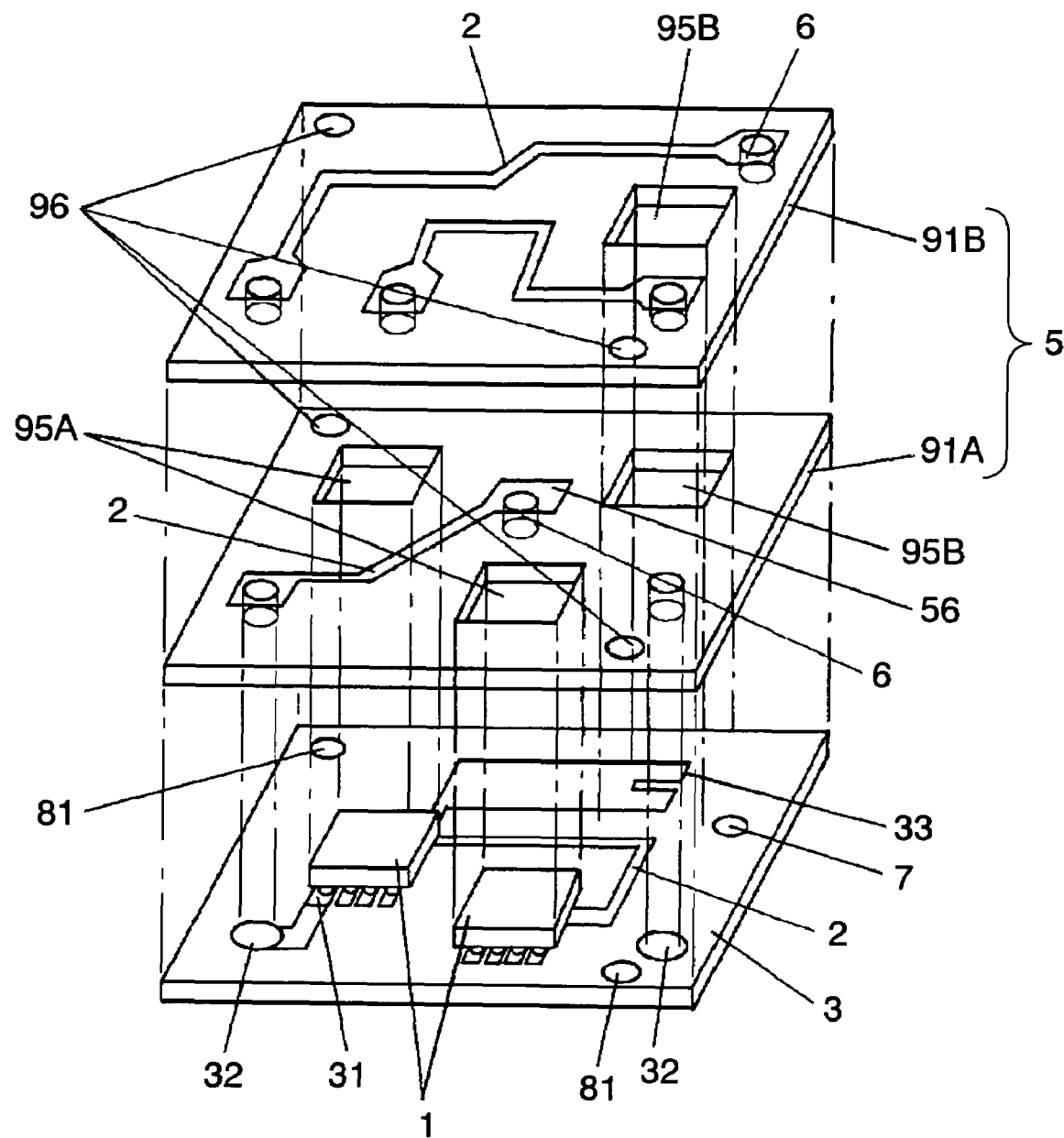
FIG. 2 shows the exploded perspective view of a module component in accordance with embodiment 1.
Figure 3B:
Figure 3C:
Figure 3D:
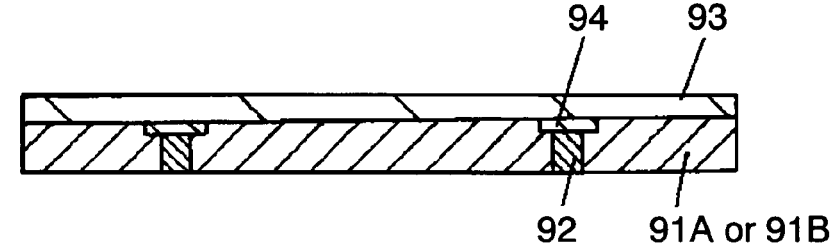
Figure 3E:
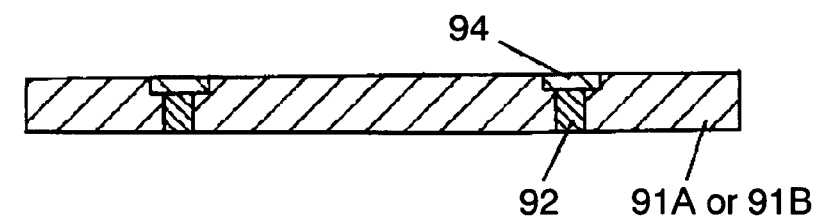
Figure 3F:
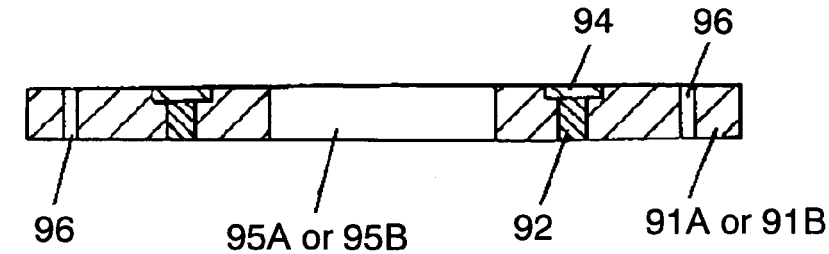

The presently used laminate sheet 91A, or 91B, has a 500 µm thickness. As shown in FIG. 3B, the laminate sheet is provided with through holes at certain specified places. The through hole is filled with a conductive paste made of metal powder and resin using a combined method of screen printing and vacuum sucking process; via 92 is thus provided. As shown in FIG. 3C, wiring pattern 94 is formed on transfer-printing film 93. As shown in FIG. 3D, transfer-printing film 93 having wiring pattern 94 is laminated on the laminate sheet having via 92, and then heat-pressed. As shown in FIG. 3E, transfer-printing film 93 is removed. Wiring pattern 94 is thus provided on the laminate sheet. As shown in FIG. 3F, a certain specific hole 95A, or 95B, is provided. At the same time, alignment hole 96 is also provided, which hole is used when laminating it with circuit substrate 3. Laminate sheet 91A, or 91B, which constitutes junction circuit substrate 5 is thus completed. In the present embodiment 1, a certain specific wiring pattern 2 is formed on laminate sheet 91A, or 91B, as shown in FIG. 2, by transfer-printing process. And then, laminate sheet 91A is provided with hole 95A corresponding to mounted component 1, and hole 95B corresponding to constant adjustment pattern 33. Hole 95B is for trimming constant adjustment pattern 33 from outside after a module component is completed.

Another laminate sheet 91B is provided with hole 95B corresponding to constant adjustment pattern 33. The holes in laminate sheet 91A, or 91B, are formed by a laser beam facility. Since the facility uses a YAG laser beam, or an ultraviolet laser beam, whose wavelength is shorter than 2 µm, it generates less heat during the hole forming operation. As the result, it causes least thermal expansion/shrinkage at laminate sheet 91A, or 91B, enabling to form the holes at a high dimensional accuracy.

The holes in laminate sheet 91A, or 91B, may be provided using a punching die, instead of using a laser beam facility.

Laminate sheet 91A and laminate sheet 91B thus prepared are overlaid one after the other on circuit substrate 3. In this way, junction circuit substrate 5 having hollow 4 of desired depth and space that fit to the size of mounted component 1 can be provided. The overlaying operation is conducted while inserting a pin through alignment hole 81 of circuit substrate 3 and alignment hole 96 of junction circuit substrate 5. There is no specific limitation regarding the kind of thermosetting resin for laminate sheet 91A, or 91B. Epoxy resin, polyimide resin, phenol resin, cyanate resin, etc. may be used. For the purpose of enhancing the mechanical strength and heat dissipation, an inorganic filler may be added to the thermosetting resin. Silica, alumina, or ferrite may be used as the inorganic filler.

Junction circuit substrate 5 of high heat conductivity and high heat dissipation can be provided by adding high heat conductivity alumina in laminate sheet 91A, or 91B. Junction circuit substrate 5 thus provided and circuit substrate 3 are integrated together by heat pressing them at 150–200° C., pressing force 100–200 kg/cm². Since the thermosetting resin at this step is in the half-cured state (B stage), junction circuit substrate 5 formed of laminate sheet 91A, or 91B, is once softened and then cured. Location of connection terminal 32 on the upper surface of circuit substrate 3 precisely coincides with via 6 formed in junction circuit substrate 5, as shown in FIG. 2. Land 56, with an area larger than the area of via 6, provides a good electrical connection between wiring pattern 2 and via 6. Circuit substrate 3 and junction circuit substrate 5 are electrically connected by heat-compressing the conductive paste which is filling via 6. Instead of the above-described configuration, connection terminal 32 may be provided in junction circuit substrate 5, while via 6 in circuit substrate 3, for implementing the same purpose. In a case where no hollow 4 is provided corresponding to mounted component 1, the following inconvenience arises when integrating circuit substrate 3 having mounted component 1 with junction circuit substrate 5.

Figure 4A:
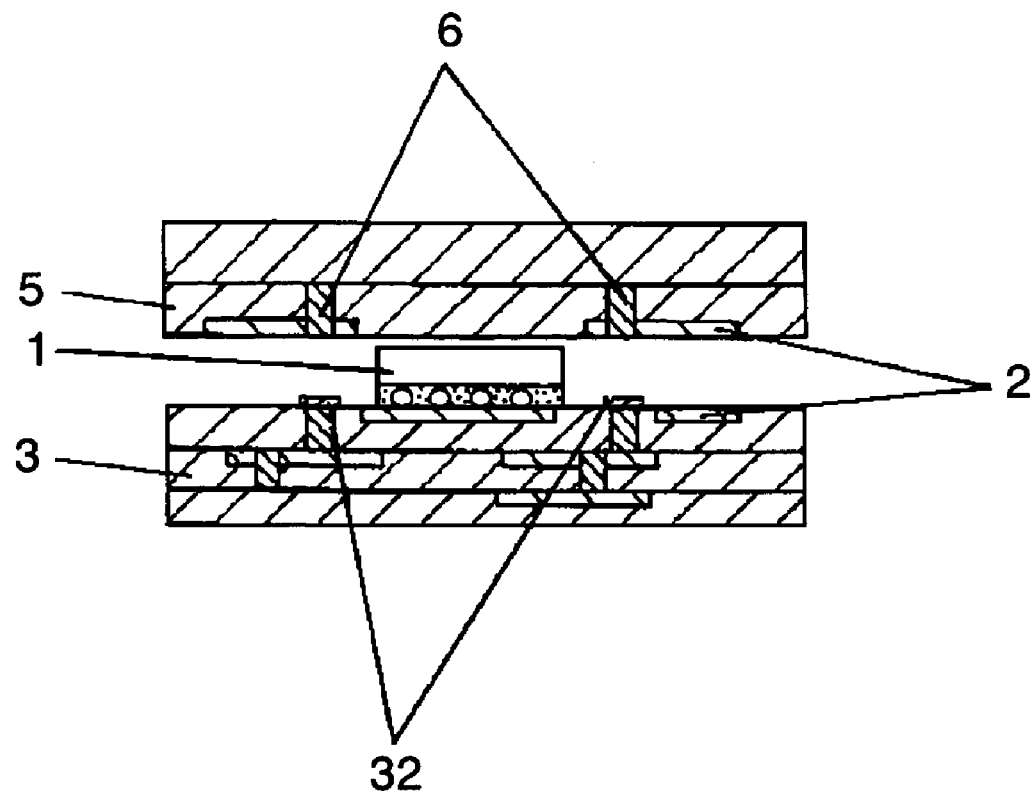
FIG. 4A and FIG. 4B are cross sectional views used to show a state in which the junction circuit substrate is provided with no hollow.
Figure 4B:
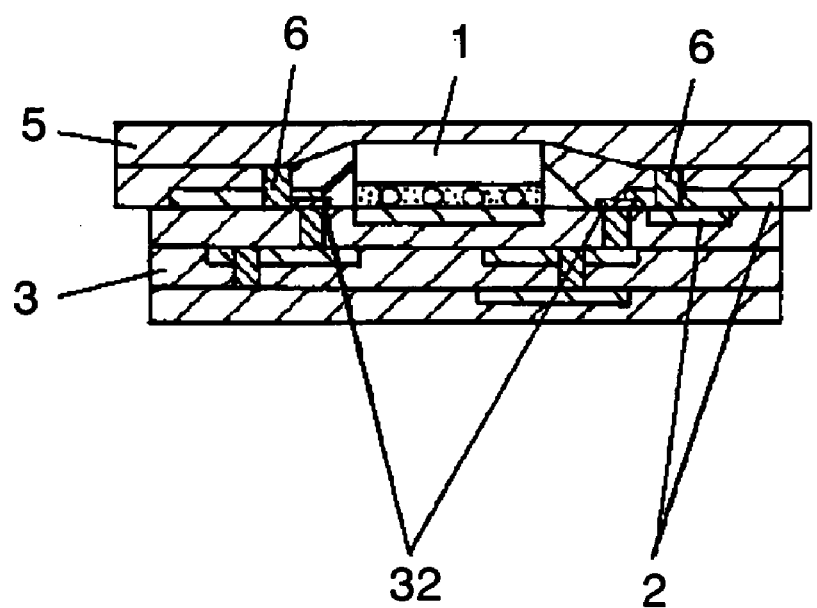

Namely, as shown in FIG. 4B, when junction circuit substrate 5 is heat-pressed, wiring pattern 2 and via 6 formed in junction circuit board 5 are transformed and displaced freely in the horizontal direction, in proportion to the volume of mounted component 1.

This is because the thermosetting resin of junction circuit substrate 5 in the state of B stage gets softened. The precise wiring pattern 2 is originally located so that it can establish electrical contact with via 6 of junction circuit substrate 5 and connection terminal 32 on circuit substrate 3. However, as described earlier, wiring pattern 2 and via 6 are dislocated by the deformation and the free movement. In other words, even if wiring pattern 2 and via 6 were provided with high precision and high density in order to make a module component smaller, the deformation and free movement caused as the result of the softened junction circuit substrate 5 at the time of integration makes it impossible to accomplish a high precision connection. If the high precision connection is to be accomplished under the above circumstance, shape of the pattern and the via for connection needs to be enlarged to be large enough to cover the amount of dislocation due to deformation and movement. Then, a circuit can not be formed within a certain desired substrate area, rendering the down-sizing of a module component difficult. Furthermore, the pressure concentrating to mounted component 1 might destroy the component.

Figure 5A:
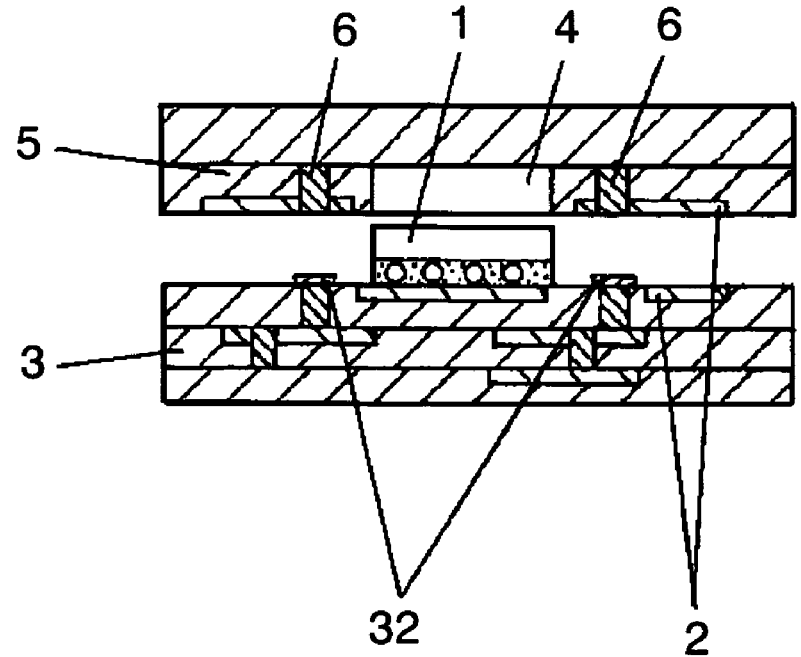
FIG. 5A and FIG. 5B are cross sectional views showing a state in which the junction circuit substrate is provided with a hollow, in embodiment 1.
Figure 5B:
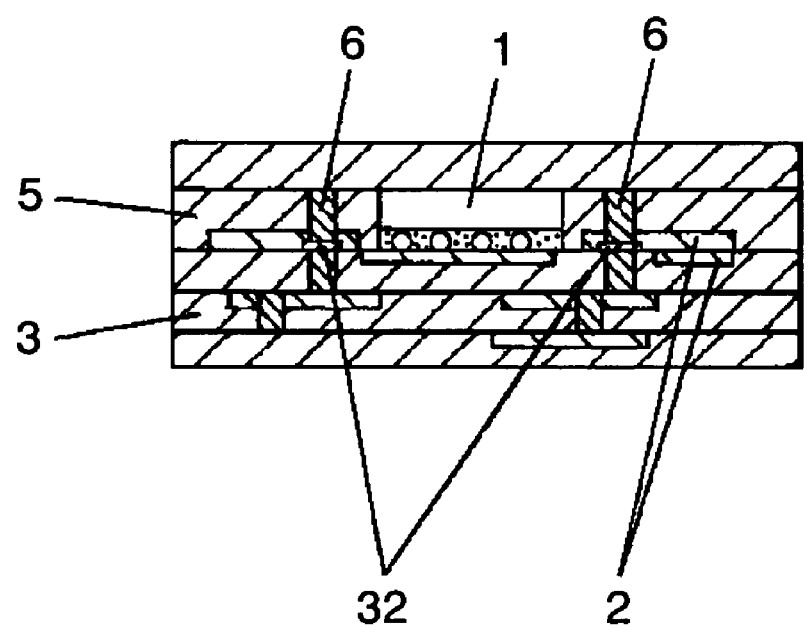

However, if junction circuit substrate 5 is provided with hollow 4 for fitting mounted component 1 in, as shown in FIG. 5A, it eliminates the deformation and free movement of thermosetting resin, which would have otherwise been caused for the amount corresponding to the volume of mounted component 1. Furthermore, since component 1 mounted and fixed on circuit substrate 3, it plays the role of a bulwark to prevent the deformation/movement of wiring pattern 2 and via 6. Thus, it regulates the dislocation of wiring pattern 2 and via 6, and the high precision connection as shown in FIG. 5B can be implemented for the downsizing of a module component. The dimensional allowance between hollow 4 and component 1 is less than 1% of the length, width and height of component 1. By so doing, the dislocation of wiring pattern 2 can be eliminated. Furthermore, since there is no concentrated pressure on mounted component 1, a possible damage on component 1 can be avoided. Thus, it provides the module components with a high reliability.

Figure 6A:
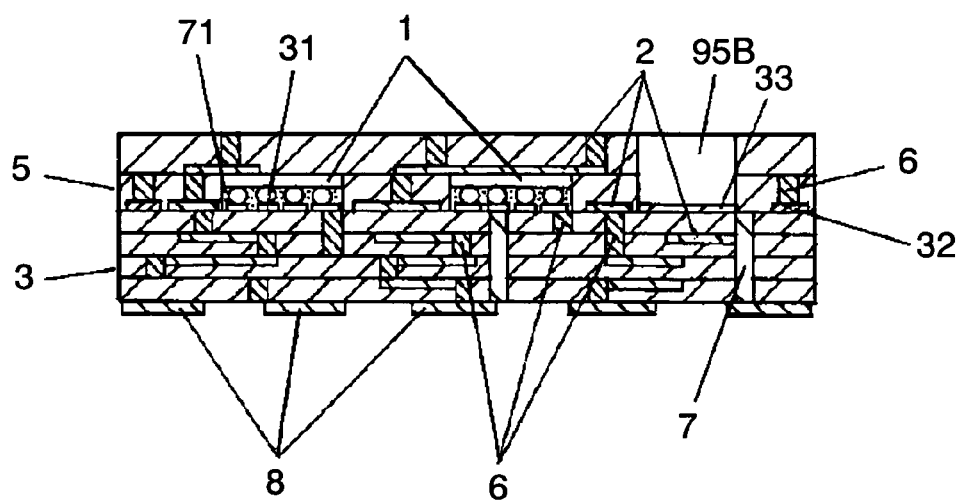
FIG. 6A and FIG. 6B are the cross sectional views of a module component in accordance with embodiment 1.
Figure 6B:
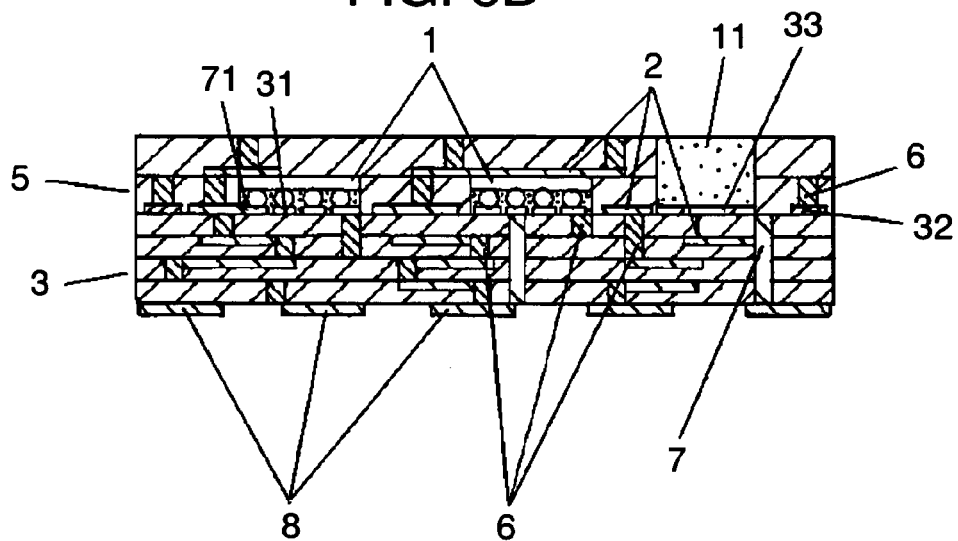

Since circuit substrate 3 and junction circuit substrate 5 are heated for integration, respective materials of circuit substrate 3 and junction circuit substrate 5 are substantially identical in the thermal expansion coefficient. As the result, the dislocation due to expansion/shrinkage of substrates can be eliminated, which helps implementing smaller and higher-precision module components. When circuit substrate 3 and junction circuit substrate 5 are integrated as shown in FIG. 6A, mounted components 1 are completely sealed without an air gap. However, hole 95B allows an additional adjustment operation to be made thereafter from the outside on constant adjustment pattern 33. The circuit constant of electrical circuit can be adjusted even after a module component is completed, by using a laser beam, Leutor (hand grinding tool), etc. After the adjustment operation, the module component is finally sealed, as shown in FIG. 6A, with sealing material 11 containing an epoxy resin as the main ingredient.

The module components completely sealed without an air gap exhibit a high reliability in the moisture absorption reflow test. If the laminated circuit substrate 3 and junction circuit substrate 5 had an air gap, the JEDEC moisture absorption reflow test conducted at the Level 1 condition result in water in the air gap. The moisture absorption conditions specified in JEDEC Reflow Level 1 are; for 168 hours in 85° C., 85% RH. When the moisturized module components are put through a reflow oven equivalent to 250° C., evaporated water shows a sharp expansion in the volume, and the components get damaged.

The module components sealed in accordance with the present invention without an air gap can survive the Level 1 moisture absorption reflow test, exhibiting no breakage. The high reliability is maintained.

Prior to integration of circuit substrate 3 and junction circuit substrate 5, the average surface roughness (Ra) of circuit substrate 3 is made to be more than 10 μm.

By so doing, the junction surface of junction circuit substrate 5 can get a firm grip into the roughened surface of circuit substrate 3, to an enhanced adhesive strength between circuit substrate 3 and junction circuit substrate 5.

Figure 7:
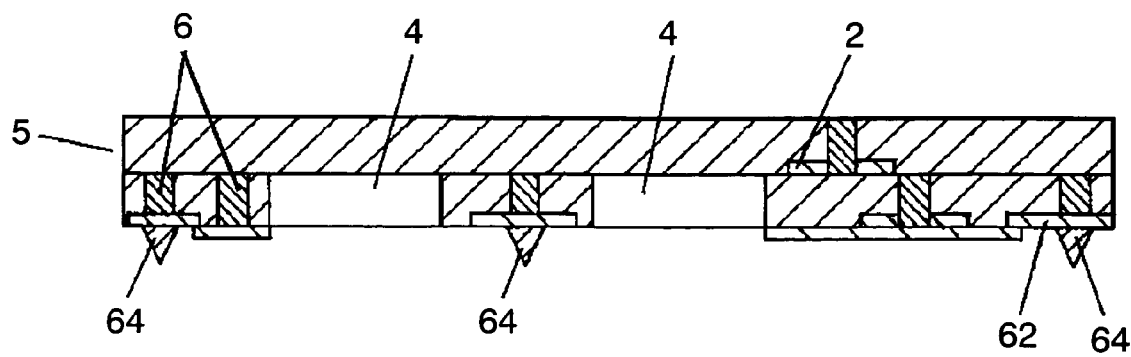
FIG. 7 shows cross sectional view of a junction circuit substrate having a protruding electrode, in embodiment 1.

Furthermore, as shown in FIG. 7, protruding electrode 64 is formed on connection terminal 62 of junction circuit substrate 5. A gold stud bump of melted gold wire formed with the help of an ultrasonic wave on connection terminal 62, or a Ni—Au bump formed by either electrolytic plating or electroless deposition serves as protruding electrode 64. Protruding electrode 64 and Ni—Au plated connection terminal 32 disposed on circuit substrate 3 accomplish the Au—Au metal bond by the heat and the pressure. This implements a surer and lower-resistance connection. Instead, a solder connection is a possibility; using solder bumps formed with a certain fixed amount of melted solder.

Figure 8:
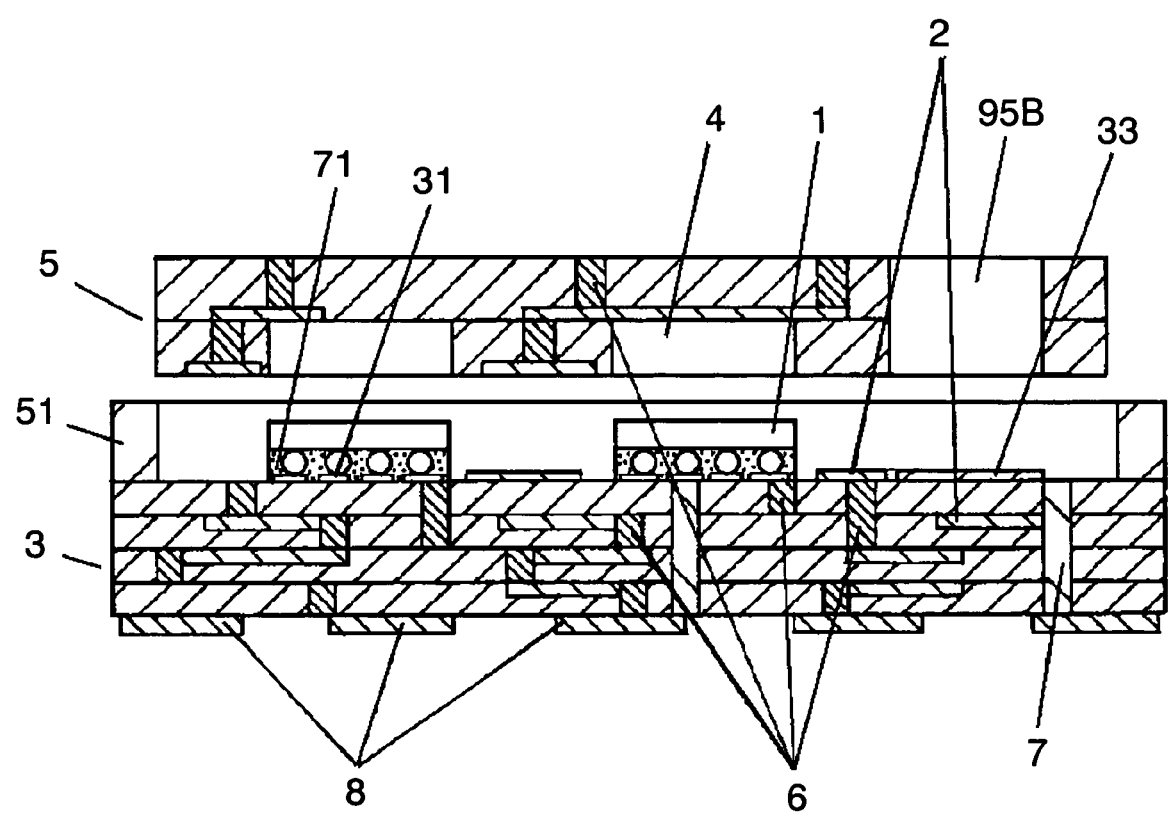
FIG. 8 shows a cross sectional view of a circuit substrate provided with a wall, in embodiment 1.
Figure 9A:
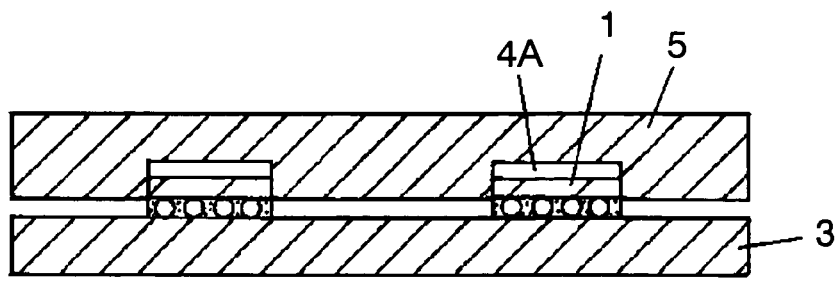
FIG. 9A–FIG. 9D are cross sectional views showing variations of the hollow in junction circuit substrates, in embodiment 1.

A module component in the present invention is formed by laminating junction circuit substrate 5 on circuit substrate 3, and the area of circuit substrate 3 is identical to or larger than junction circuit substrate 5. As a result, junction circuit substrate 5 can be laminated on circuit substrate 3 with ease, which leads to a higher productivity in the manufacture. Furthermore, as shown in FIG. 8, circuit substrate 3 may be provided at the upper surface with wall 51 for placement regulation. The wall 51 prevents wiring pattern 2 and via 6 of junction circuit board 5 from making a free movement on the surface. This enables to maintain a high accuracy in the dimensions of connection. Furthermore, as shown in FIG. 9A, the size of hollow 4A of junction circuit substrate 5 is identical to or slightly smaller than the shape of mounted component 1. As the result, mounted component 1 is press-fit tightly with hollow 4A. In this way, there is no gap between mounted component 1 and junction circuit substrate 5, and the connection reliability is improved.

Figure 9B:
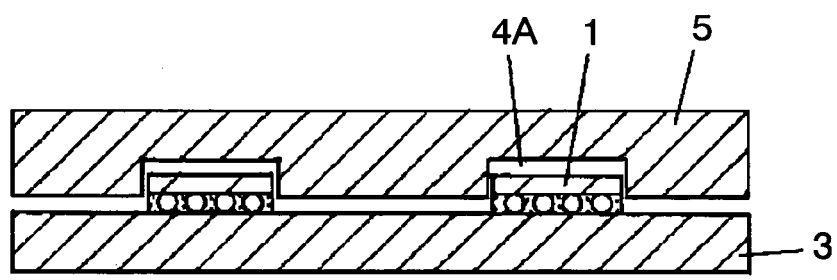
Figure 9C:
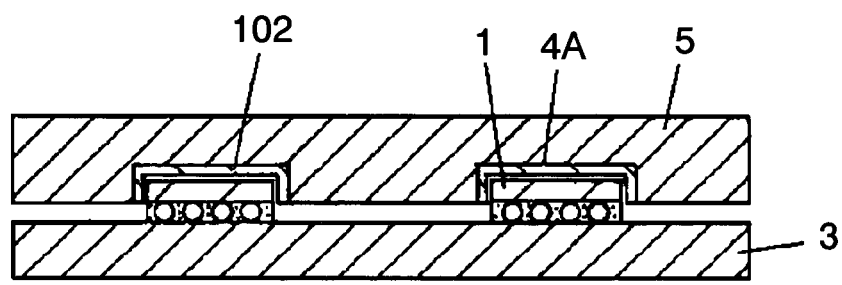
Figure 9D:
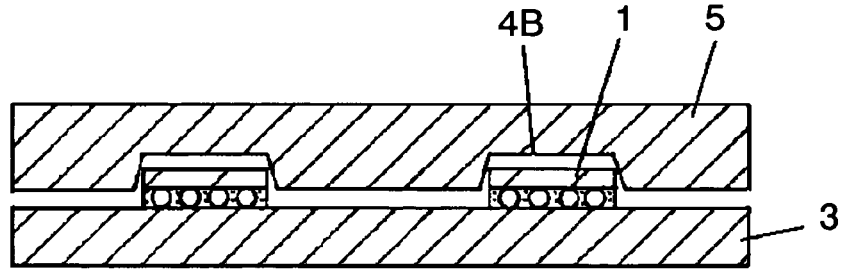
Figure 10A:
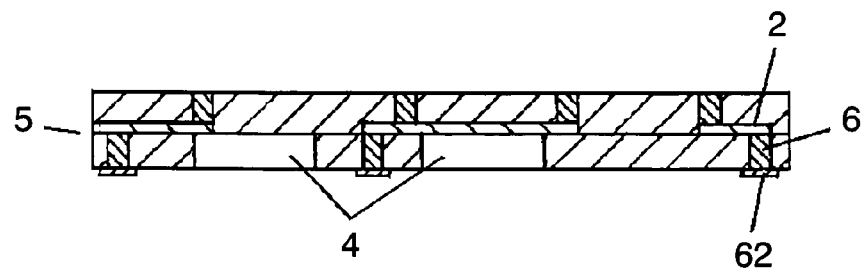
FIG. 10A–FIG. 10D are cross sectional views showing variations of the junction circuit substrate, embodiment 1.
Figure 10B:
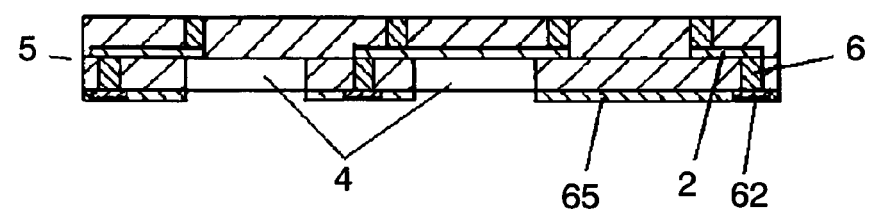
Figure 10C:
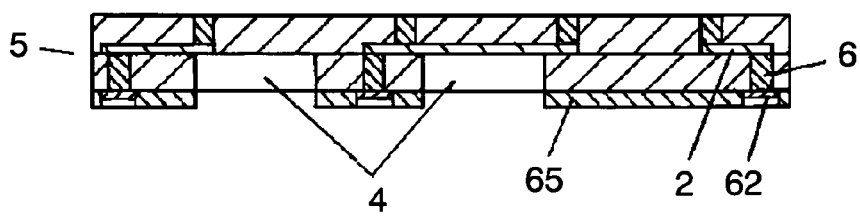
Figure 10D:
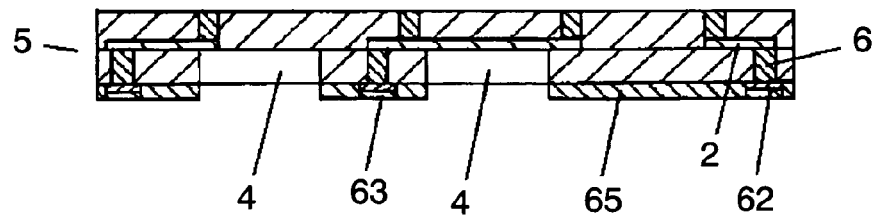

The size of hollow 4A can be identical to or larger than that of mounted component 1, as shown in FIG. 9B. This makes the laminating operation easier. The gap existing between hollow 4A and mounted component 1 is filled while a pressure is given for lamination. As shown in FIG. 9C, elastic member 102 is provided on the wall surface of hollow 4A, for filling the gap between mounted component 1 and wall surface of hollow 4A. As a result, the outside air can be totally blocked, and the gap with mounted component 1 is filled. This can further improve the reliability at the moisture absorption reflow test, etc. As for the elastic member, a silicone rubber, a fluoro rubber, etc. may be used. Or, as shown in FIG. 9D, hollow 4B may take a trapezoid form in the cross sectional shape, with the mouth broader. The trapezoid form makes the aligning at the fitting operation of mounted component 1 with hollow 4B easier. As described in the above, FIGS. 9A–FIG. 9D exhibit variations of hollow 4A and 4B in their cross sectional shapes. The above concepts of variation are applicable also to such cases where hole is formed, besides hollow 4A, 4B. Junction circuit substrate 5 in the present embodiment 1 has been described based on a resin substrate using prepreg. However, other high-rigidity substrate may be used for junction circuit substrate 5, with a connection layer provided at the junction surface of junction circuit substrate 5 and circuit substrate 3. After circuit substrate 3 and junction circuit substrate 5 are laminated, the substrates are integrated into a single body by curing the connection layer with a heat, a pressure or an energy beam; and a finished module component is completed. The energy beam includes an electron beam, X-ray beam and a radiation beam, etc. The high-rigidity substrate includes a cured resin substrate, a ceramic substrate, a metal substrate and a composite resin substrate made of a mixture containing inorganic filler and thermosetting resin, and cured, and others. A preferred inorganic filler is alumina. Since these ceramic substrates, metal substrates, composite resin substrates containing alumina as the main ingredient are provided with a high thermal conductivity, they can effectively radiate the heat generated from the heat-generating component 1. A point of difference from junction circuit substrate 5 formed of prepreg material is that junction circuit substrate 5 and circuit substrate 3 are connected by means of an adhesive layer. Junction circuit substrate 5 shown in FIG. 10A is a multi-layered ceramic substrate. The inner layer of which substrate is provided with via 6 for the layer-to-layer electrical connection. Provided at the lower surface of junction circuit substrate 5 are hollow 4 which corresponds to mounted component 1 and connection terminal 62 which is slightly pushing out of the lower surface for electrical connection with circuit substrate 3. On the surface of junction circuit substrate 5 opposing to the connection surface of circuit substrate 3, adhesive layer 65 is provided as shown in FIG. 10B. Adhesive layer 65 is formed by applying an adhesive agent which contains an epoxy resin as the main ingredient. At the connection with circuit substrate 3, connection terminal 62 establishes an electrical connection with connection terminal 32 of circuit substrate 3 by breaking adhesive layer 65 through. Or, as shown in FIG. 10C, when providing adhesive layer 65 on the exposed surface of junction circuit substrate 5, the area of connection terminal 62 which makes contact with circuit substrate 3 may be excluded. By so doing, the reliability in the connection with circuit substrate 3 is improved. Or, as shown in FIG. 10D, adhesive layer 65 may be formed evading connection terminal 62 of junction circuit substrate 5, while conductive layer 63 is provided on connection terminal 62. This structure further improves the connection reliability. Conductive layer 63 is formed by applying a conductive paste. As for the adhesive agent, a two-liquid type adhesive or an anaerobic adhesive may be used. Besides the liquid adhesives, an adhesive agent in the form of an adhesive sheet can be used.

In the case where a resin sheet containing thermosetting resin or thermoplastic resin as the main ingredient is used for the adhesive sheet, if its filler contained conductive particles the connection resistance is reduced a step further. The conductive layer provided at the open region realizes another reduction in the connection resistance.

Figure 11A:
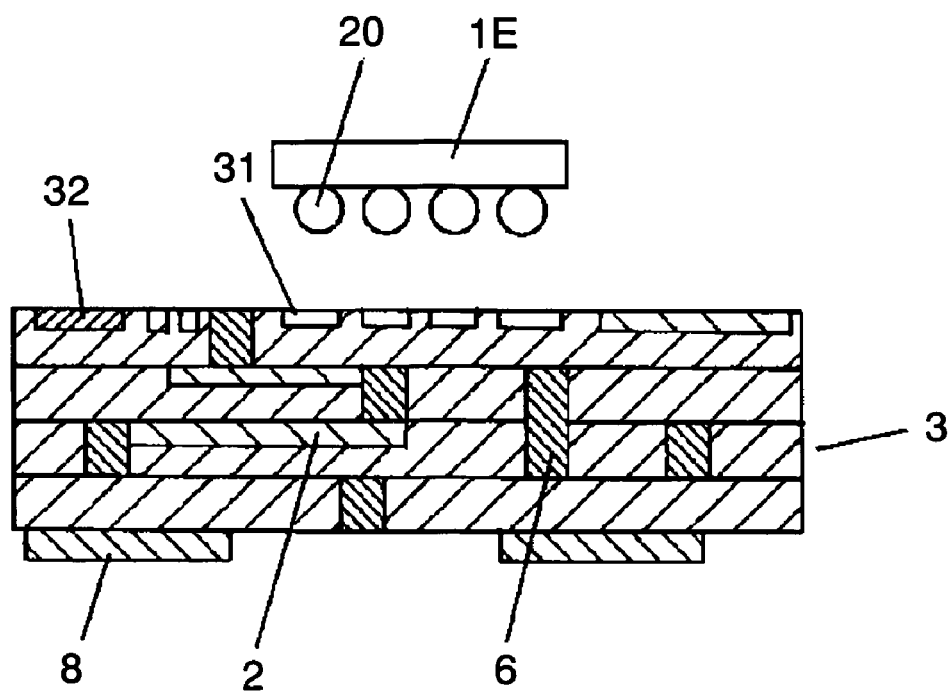
FIG. 11A and FIG. 11B are cross sectional views showing the process of mounting the component, in embodiment 1.
Figure 11B:
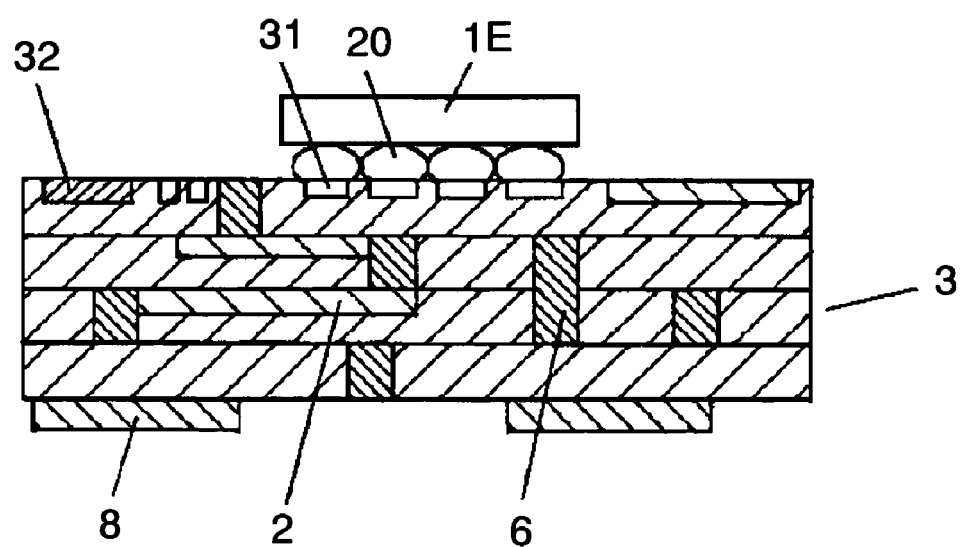
Figure 12A:
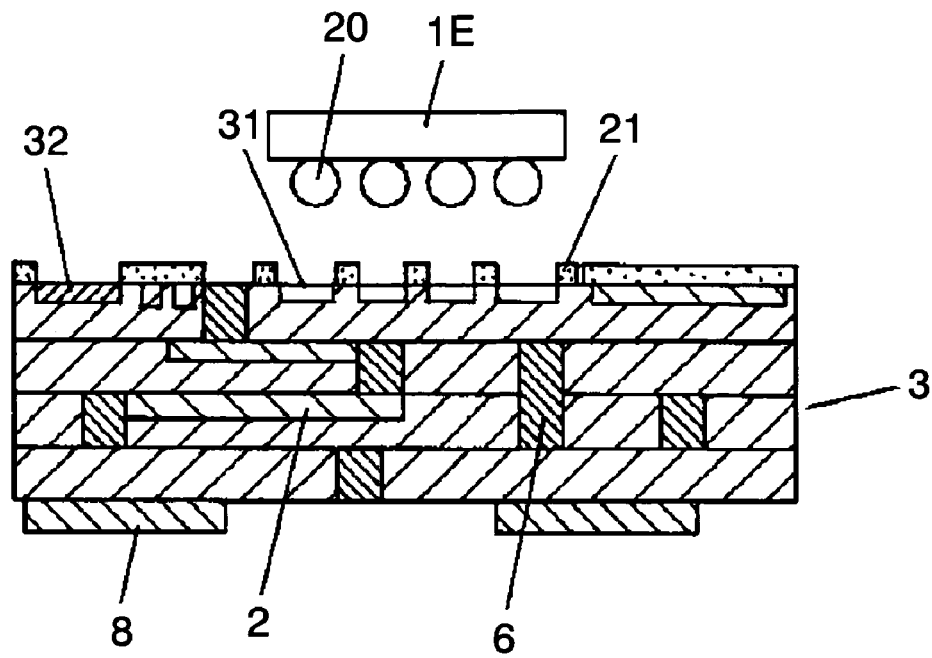
FIG. 12A and FIG. 12B are cross sectional views showing the process of mounting the component, in embodiment 1.
Figure 12B:
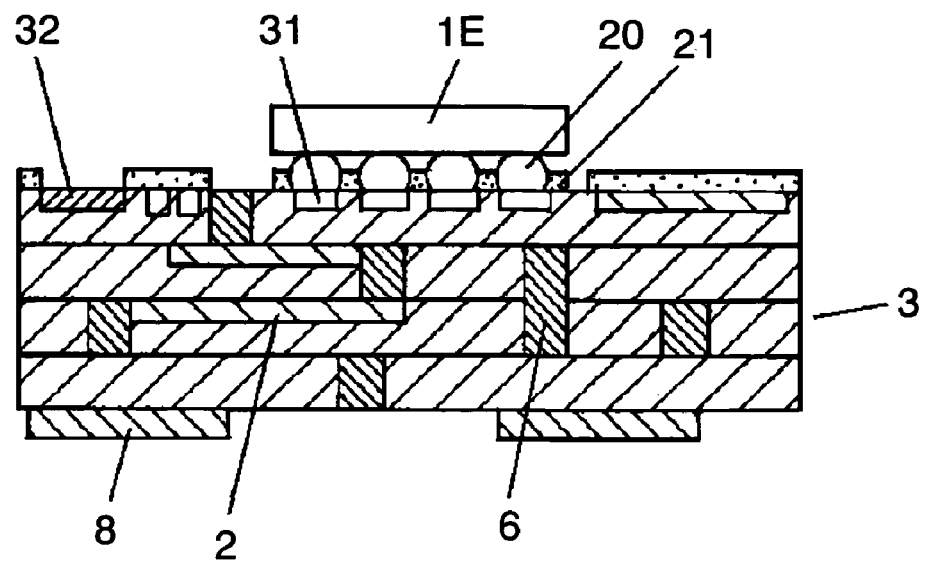
Figure 13A:
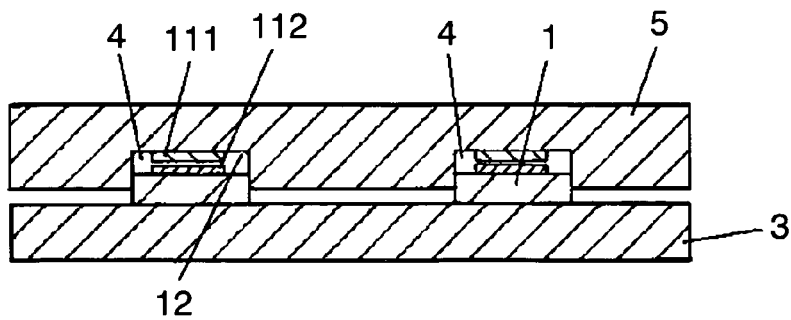
FIG. 13A–FIG. 13D are cross sectional views showing variations of the hollow, in embodiment 1.

Component 1 can be mounted on circuit substrate 3 with a solder or a conductive paste. For mounting a semiconductor bear chip, among other components, there are two mounting methods; viz. connecting at a relatively low temperature using an anisotropic conductive resin sheet or a conductive paste, or connecting at a high temperature using a solder or gold. In either one of the mounting methods, the flatness of circuit substrate 3 at the surface of connection area, where the bare chip is mounted, is to be less than 10 μm. The solder mounting method is suitable to volume production, so it is often used. When component 1E, which is a bare chip having solder bumps 20 as shown in FIG. 11A, is connected with connection terminals 31 provided on the surface of circuit substrate 3, connection terminals 31 are disposed in accordance with the pitch of solder bumps 20. The pitch, however, is very small as shown in FIG. 11B, therefore a melted solder sometimes flows out of the own connection terminal to reach other terminals. This leads to short-circuiting between the connection terminals, and makes it difficult to maintain certain predetermined electrical characteristics. In order to prevent the short-circuiting trouble, circuit substrate 3 is provided with walls between respective connection terminals 31, as shown in FIG. 12A, which walls being made of resist 21 formed of a resin as the main ingredient. The wall of resist 21 is provided also in other areas than connection terminal 32. As shown in FIG. 12, resist 21 is needed to prevent the solder from flowing on wiring pattern 2. It is not always necessary to provide resist 21 over the whole area, but the resist may be provided only in such a region where the solder flow has to be avoided. Although resist 21 is provided on circuit substrate 3 in the above descriptions, it can also be provided with respect to wiring pattern 2 formed on junction circuit substrate 5. Hollow 4 of junction circuit substrate 5 may be provided at the bottom surface 12 with terminal 111, as shown in FIG. 13A. An FET and the like component 1 having its terminal 112 at the opposing surface can be connected electrically by making use of terminal 111. The electrical connection between terminal 111 and terminal 112 of mounted component 1 may be accomplished by a pressure connection. When a conductive layer or an anisotropic conductive sheet is provided on terminal 112, the electrical connection is implemented at a still lower resistance.

Figure 13B:
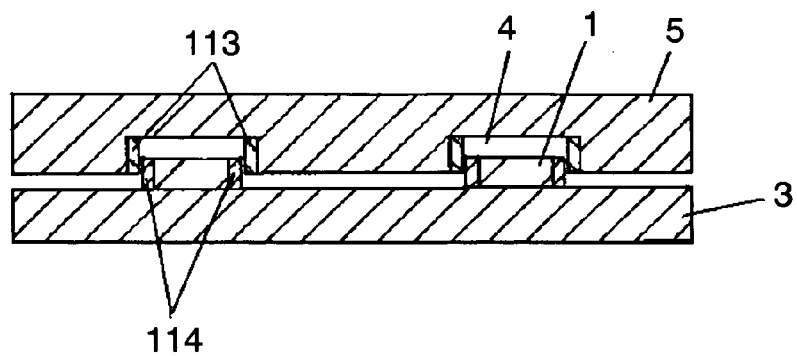
Figure 13C:
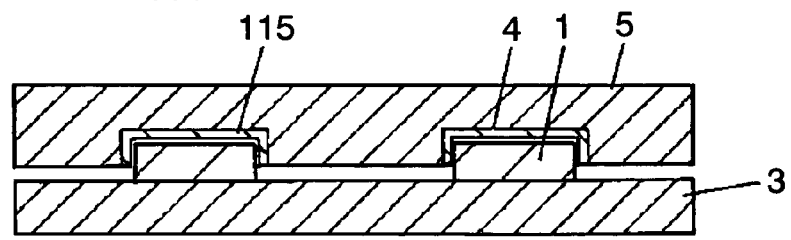
Figure 13D:
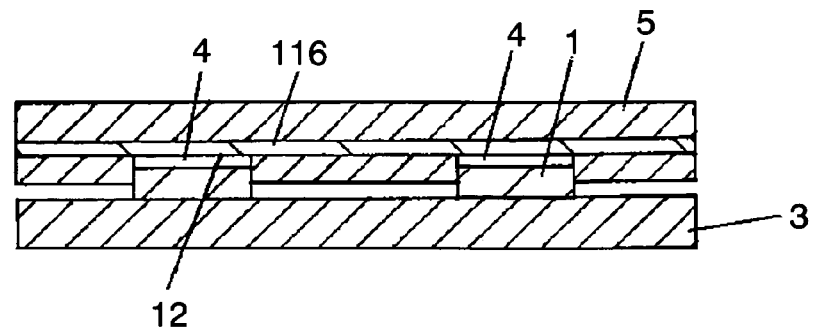

Hollow 4 of junction circuit substrate 5 may be provided at the side surface with terminal 113, as shown in FIG. 13B. This enables component 1 to establish electrical contact at its side-face electrode 114 with terminal 113. In this way, junction circuit substrate 5 can be connected direct with mounted component 1, not via circuit substrate 3. Furthermore, as shown in FIG. 13C, hollow 4 of junction circuit substrate 5 may be provided in the inside with shield layer 115 formed of gold, copper or other conductive material. This helps suppress the influence of noise generated from mounted component 1 to a minimum level. Still further, as shown in FIG. 13D, hollow 4 of junction circuit substrate 5 may be provided at the bottom surface 12 with heat conductive layer 116 of copper or the like metal. Component 1 having its heat radiation layer at the portion other than the place of connection terminal, e.g. power supply semiconductor device, is disposed so that it makes contact with heat conductive layer 116. In this way, the heat generated from mounted components can be discharged more efficiently. Although, in the present embodiment, no component 1 is mounted on junction circuit substrate 5 at the surface reverse to that facing to circuit substrate 3, the reverse surface may of course be mounted with component 1.

Figure 14:
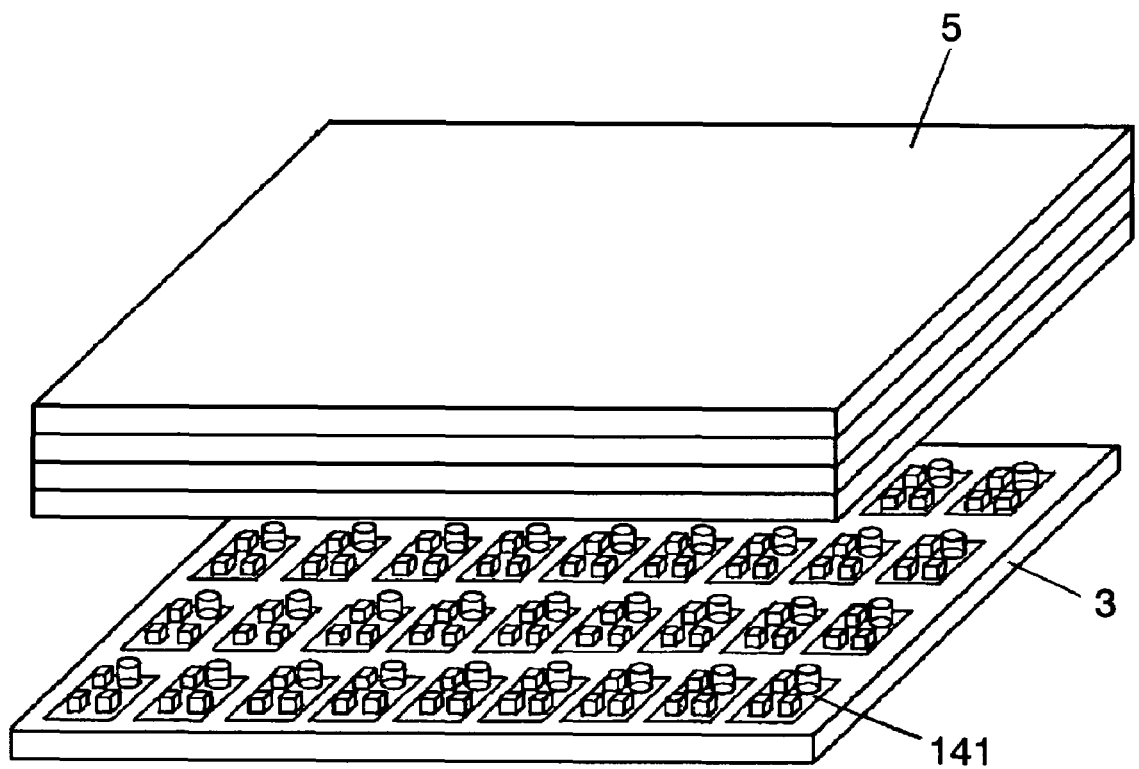
FIG. 14 is an exploded perspective view used to show a process of manufacturing a plurality of module components at one time, in embodiment 1.

Description in the present embodiment 1 has been based on the process of manufacturing module components piece-by-piece. However, a number of module components 141 can be manufactured altogether at once, as shown in FIG. 14, to be separated later into individual module components. In this case, there is no need of providing aligning hole, protrusion or wall for each of the individual module components. In order to implement a higher reliability in the connection of module component and the mother substrate, the thermal expansion coefficient of circuit substrate 3 should preferably be identical to that of junction circuit substrate 5. When both substrates have substantially the same thermal expansion coefficient, possible warp of a module component that would arise at the reflow connection with the mother substrate can be suppressed. Namely, the bending stress is reduced, and breakage and short-circuiting of wiring pattern 2 can be eliminated. Thus a high mounting reliability is realized. Although description has been made only on hollow 4, the same advantages are implemented also with the through holes. In the case of a through hole, if the connecting portion of mounted component 1 is exposed to the outside air the environmental withstanding capability deteriorates. In order not to invite such a disadvantage, the hole used for inserting component 1 is filled and closed with an epoxy resin or the like material. Thus the environmental withstanding capability is preserved by keeping the connected portion unexposed to the outside air. In the above descriptions, one hollow 4 has been provided for fixing one individual component 1 each. However, one hollow 4 may house a plurality of components 1 which have been disposed in proximity to each other.

(SECOND EXEMPLARY EMBODIMENT)

In the present embodiment 2, other example of module component containing mounting components in accordance with the present invention is described.

Figure 15A:
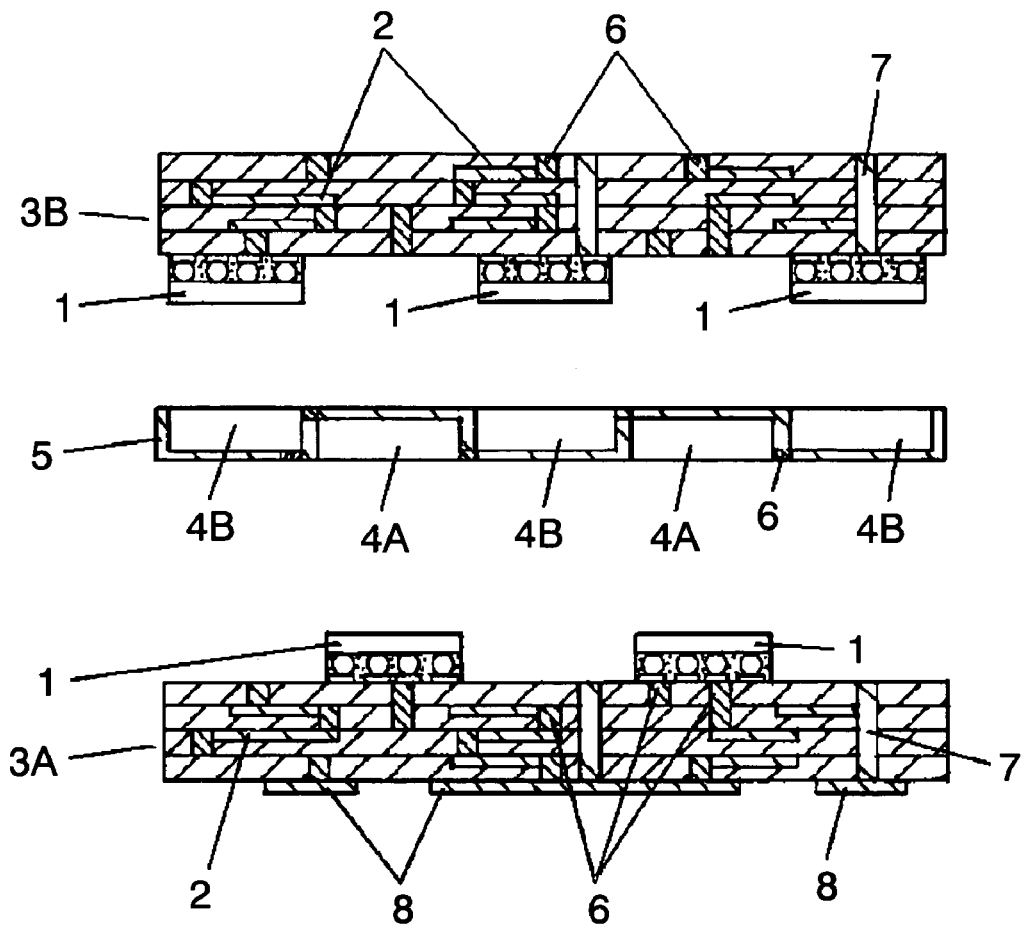
FIG. 15A shows the cross sectional views of a separated module component in accordance with a second exemplary embodiment of the present invention.
Figure 15B:
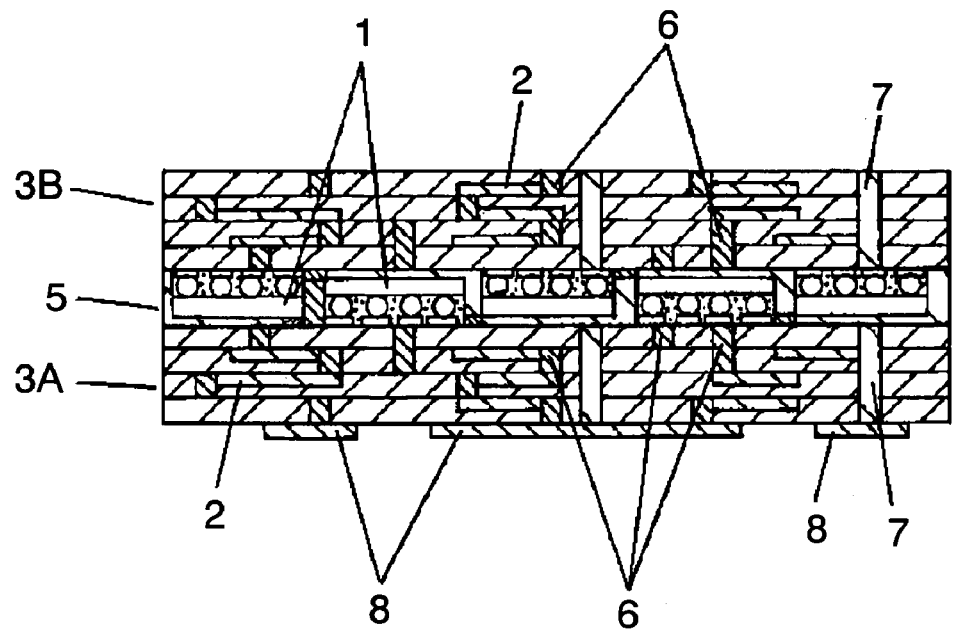
FIG. 15B shows the cross sectional view of a module component in embodiment 2.

As shown in FIG. 15A and FIG. 15B, each of circuit substrate 3A and circuit substrate 3B is mounted on the surface with component 1. Circuit substrate 3A and circuit substrate 3B are held together, with junction circuit substrate 5 in between the two. Therefore, junction circuit substrate 5 is configured to have hollow 4A which corresponds to component 1 mounted on circuit substrate 3A, and hollow 4B which corresponds to component 1 mounted on circuit substrate 3B.

Components 1 on respective circuit substrates 3A and 3B are mounted so that each of them does not overlap with the one on other circuit substrate at the same location. In this way, respective components 1 on the two circuit substrates are eventually disposed flat in the same level. In the past, the needs for increasing the integration of a circuit within a limited area and for reducing the overall size and flatness were met by making wiring pattern 2 finer. In practice, wiring pattern 2 is extended around here and there, and a number of mounting components 1 is disposed densely on the surface of circuit substrate 3. The number of vias 6 inevitably increases, so is the number of lamination layers. As the results, mechanical strength of circuit substrate 3 deteriorates, while the increased layer counts increases the thickness. Namely, the downsizing target is not implemented through the conventional procedures. However, in the present invention where circuit substrate 3A and circuit substrate 3B are disposed respectively at the up and down of junction circuit substrate 5, the density of mounting components 1 can be raised using the already existing wiring rules. Furthermore, thickness of module components can be reduced; which is an additional advantage for making the height of an apparatus lower. In the present embodiment 2, no component has been mounted on the surface of circuit substrates 3A, 3B reverse to that facing to junction circuit substrate 5; however, the reverse surfaces may of course be mounted with components 1.

(THIRD EXEMPLARY EMBODIMENT)

Figure 16A:
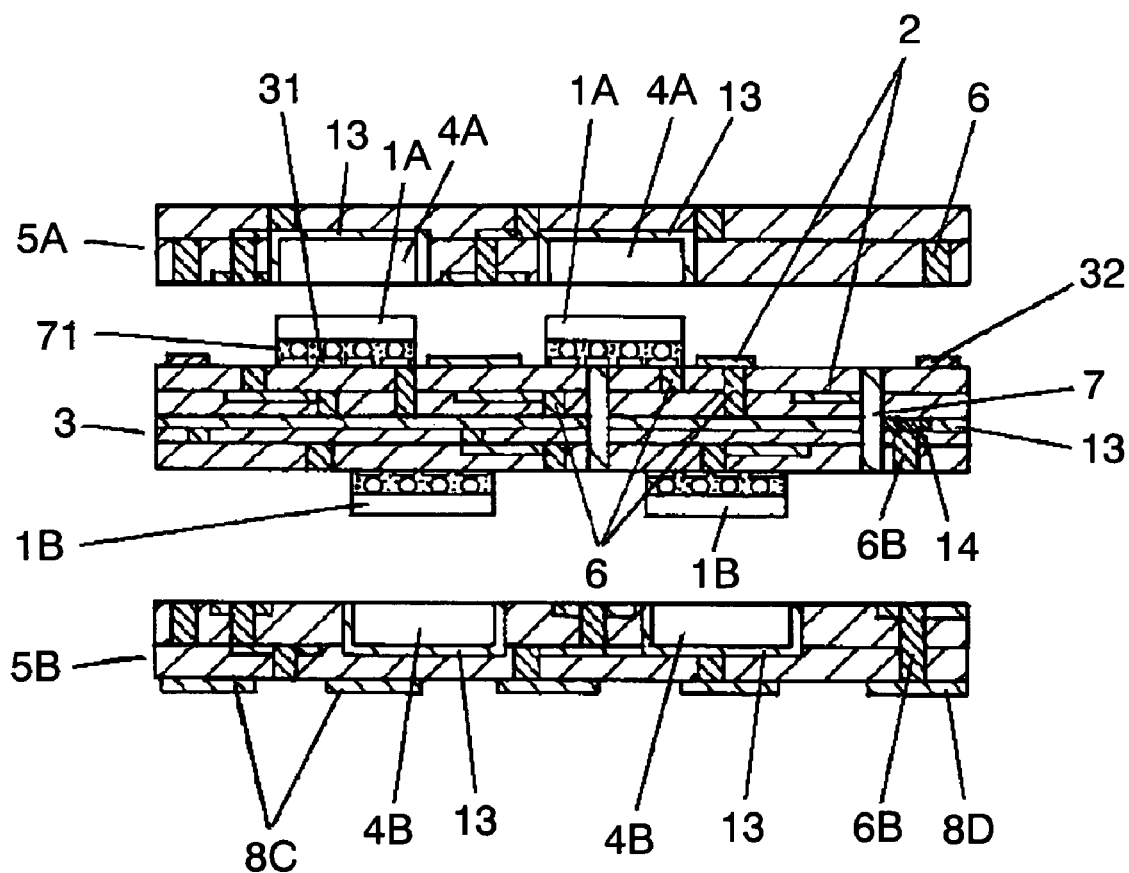
FIG. 16A shows the cross sectional views of a separated module component in accordance with a third exemplary embodiment of the present invention.
Figure 16B:
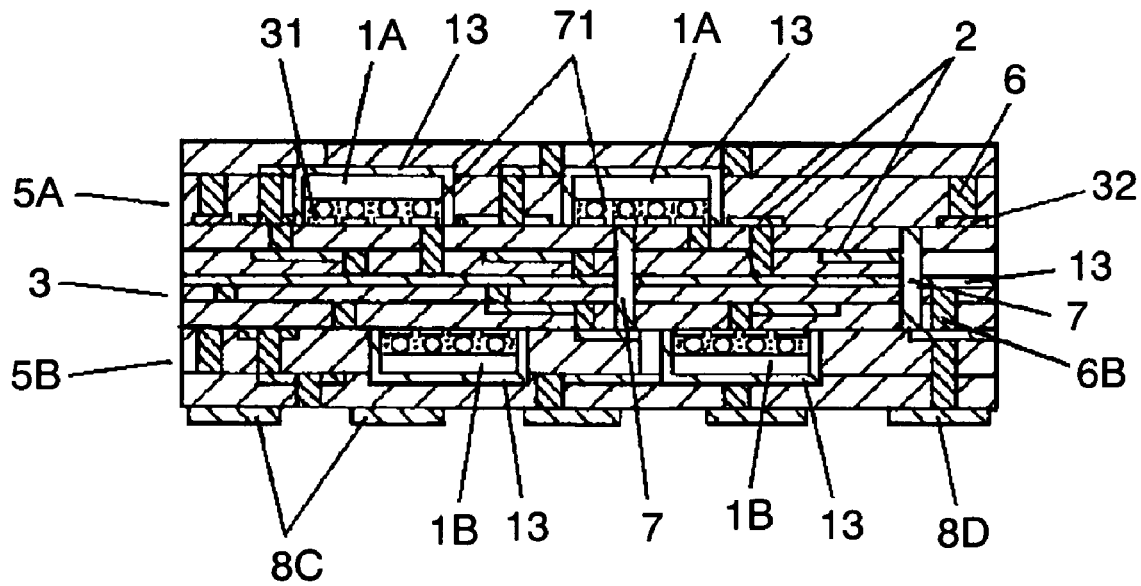
FIG. 16B shows the cross sectional view of a module component in embodiment 3.

Embodiment 3 in the present invention is described referring to FIG. 16A and FIG. 16B.

A module component in embodiment 3 is an example in which analog circuit and digital circuit are incorporated together. Circuit substrate 3 is mounted at the upper surface with components 1A forming an analog circuit. Circuit substrate 3 is mounted at the lower surface with components 1B forming a digital circuit. In the inside of circuit substrate 3, shield layer 13 and ground electrode 14 are provided. Junction circuit substrate 5A has hollows 4A which correspond to components 1A mounted on the upper surface of circuit substrate 3. Junction circuit substrate 5B has hollows 4B which correspond to components 1B mounted on the lower surface of circuit substrate 3. Shield layer 13 is formed on the surface of hollow 4B. Junction circuit substrate 5B is provided with connection terminals 8C and 8D for electrical connection with the mother substrate. Among the connection terminals, terminal 8D is connected with the GND electrode of mother substrate. Connection terminal 8D is further connected with ground electrode 14 of circuit substrate 3 by way of via 6B.

The method of lamination remains the same as in embodiment 1. In the present configuration, where analog circuit and digital circuit are disposed on the upper and the lower surfaces, respectively, of one circuit substrate 3, digital signal can be overlaid as noise on analog signal, which would lead to an operation error. Therefore, the digital circuit needs to be shielded so that no digital signal escapes as noise. While in the analog circuit, it is important to protect itself against noise by means of shielding, for keeping the reliability of the signal it processes.

When disposing both digital circuit and analog circuit mixed in a certain limited space, each of the circuits has to be shielded by means of metal shield case. Thus the size of a module component inevitably goes big. In a configuration where the circuits are disposed on the upper surface and the lower surface, respectively, of circuit substrate 3, it is needed to have the shield case both on the upper and the lower surfaces. In this structure, the terminal for connection with mother substrate needs to be disposed somewhere in the area having no shield case. As the result, the total structure of a module component becomes complicated.

As a solution of these problems, shield layer 13 is formed within circuit substrate 3, as well as on the inner surface of hollows 4A, 4B of junction circuit substrates 5A, 5B. By so doing, the respective analog circuit and the digital circuit can be shielded. In this way, the size of module component does not go bigger, and the terminal for connection with mother substrate can be disposed at the lower surface of junction circuit substrate 5B. Shield layer 13 formed in circuit substrate 3 as the reference GND for respective circuits, and the GND potential of mother substrate are brought to the same level. By so doing, the circuits formed on circuit substrate 3 can be kept to be free of parasitic LCR; and the reliability of electric signals can be ensured. Thus, a compact module component is offered in accordance with the present invention, where the electrical characteristics are not deteriorated even when analog circuit and digital circuit are disposed together.

Circuit substrate 3 may be formed of a laminate substrate of different materials, or an integration of a ceramic substrate and a composite resin substrate. If the composite resin substrate is formed of ferrite and ceramic as the inorganic filler, it removes the noises from mounted component 1 and circuit pattern 2. Namely, since the circuit substrate 3 can separate the electric circuits electrically, it can be used as a circuit substrate 3 having the shielding effects.

Another example of the laminate substrate of different materials is an integration of composite resin substrates, where each one composite resin substrate containing an inorganic filler consisting of either one of the high dielectric constant material, the low dielectric constant material and the ferrite material. When a laminate body having various dielectric constant and magnetic permeability is used, a chip capacitor, a resistor, a coil, etc. which used to be mounted on the circuit substrate can be formed within the inside of the laminate body. As the result, the size of a module component can be made smaller. Although, in the present embodiment 3, circuit substrate 3 has been formed in a laminate substrate of different materials, the same idea can be applied to junction circuit substrate 5.

(FOURTH EXEMPLARY EMBODIMENT)

Figure 17A:
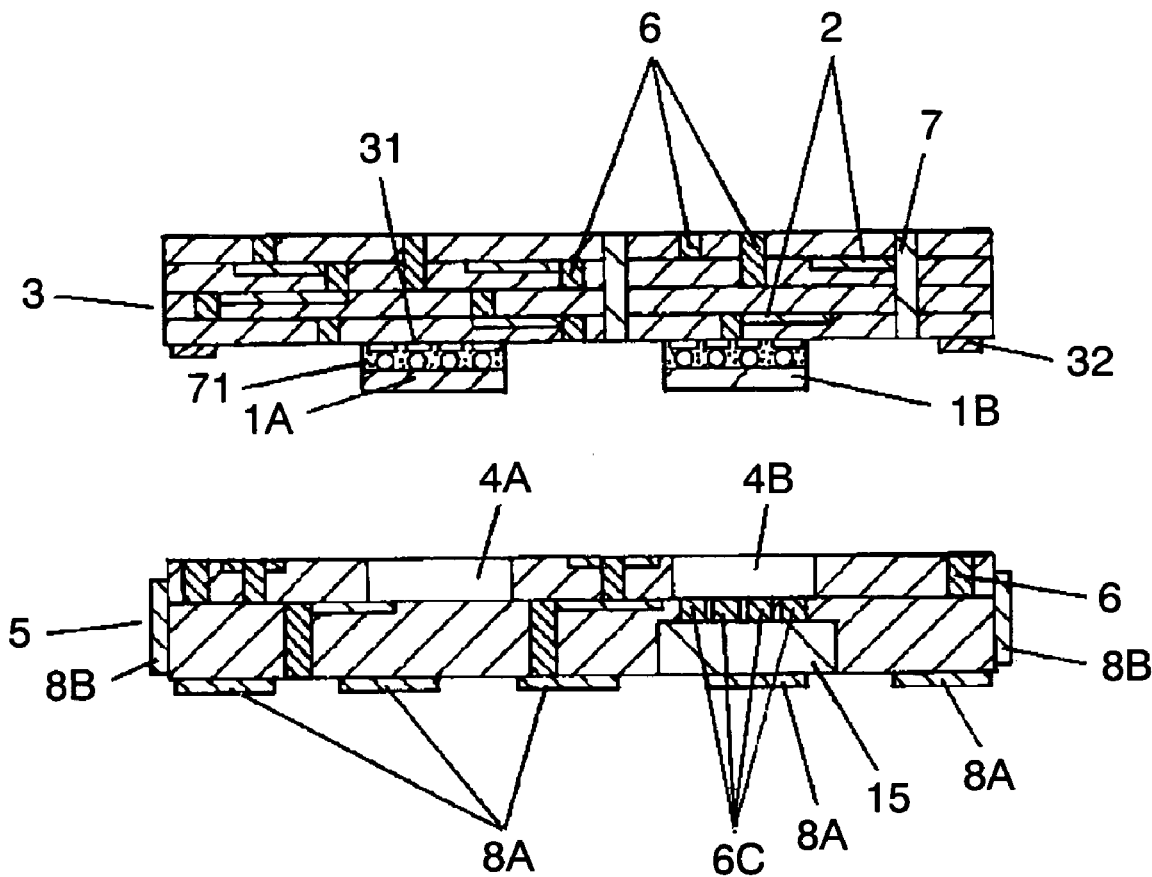
FIG. 17A shows the cross sectional views of a separated module component in accordance with a fourth exemplary embodiment of the present invention.
Figure 17B:
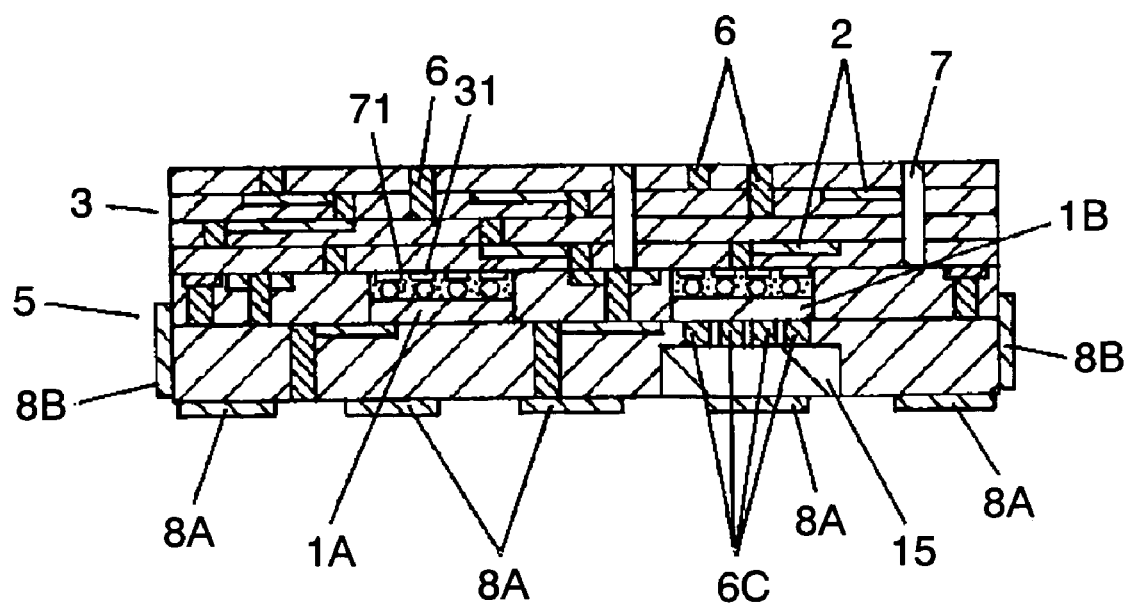
FIG. 17B shows the cross sectional view of a module component in embodiment 4.

A module component in accordance with embodiment 4 is described referring to FIG. 17A and FIG. 17B. Components 1A and 1B are mounted on the lower surface of circuit substrate 3. Junction circuit substrate 5 is provided with hollows 4A and 4B corresponding to mounted components 1A and 1B.

In a module circuit for DC/DC converter, among others, a switching power supply IC is mounted for component 1B. Since it generates a substantial amount of heat, junction temperature of the power supply IC easily goes beyond the tolerable level, and goes into trouble unless an appropriate heat radiation measure is taken quickly. As the countermeasure, junction circuit substrate 5 is provided at the bottom of hollow 4B with via 6C, and a metal body of high thermal capacitance such as copper, aluminum, etc. is buried in part of junction circuit substrate 5 as heat radiation member 15 in a manner that it makes contact with via 6C. Under this configuration, the high temperature generated at a certain part of mounted component 1B is conveyed through via 6C formed in junction circuit substrate 5 to heat radiation member 15 to be efficiently conducted to external connection terminal 8A. Thus, the heat is quickly discharged to the outside. In embodiment 1, terminal 8A of LGA structure and terminal 8B of side face electrode are disposed on circuit substrate 3. In the present embodiment 4, these are disposed on junction circuit substrate 5.

In the pattern designing, it has been an important point of consideration how to discharge the heats generated from heat-generating components such as a power supply IC. As the result, the locations for these components are restricted, so the downsizing was difficult.

Figure 18A:
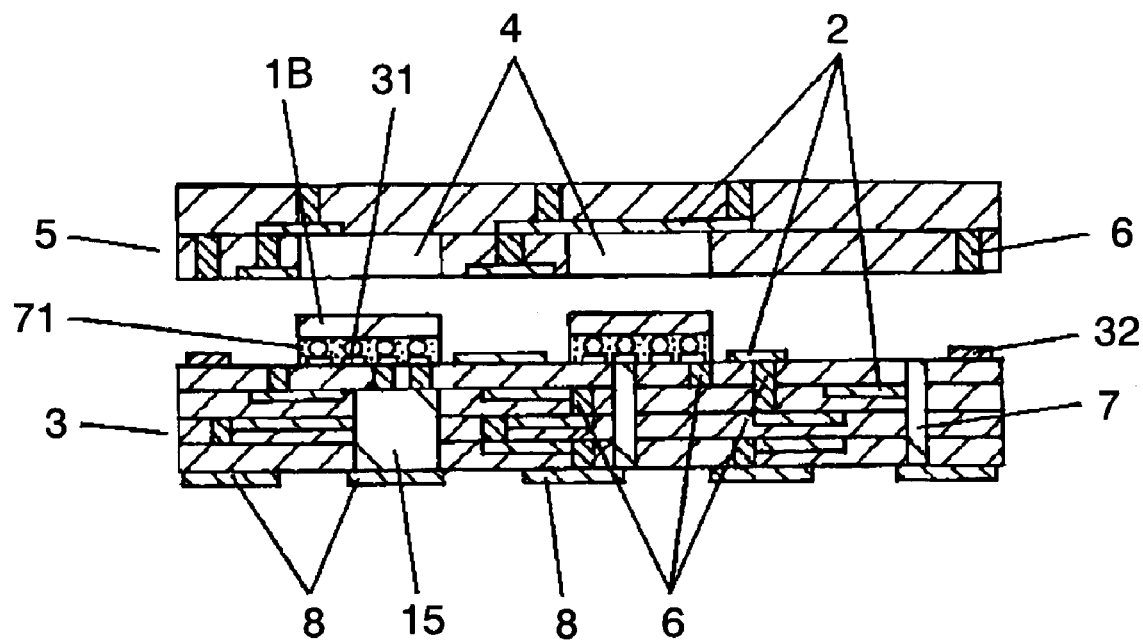
FIG. 18A shows the cross sectional views of other separated module component in embodiment 4.
Figure 18B:
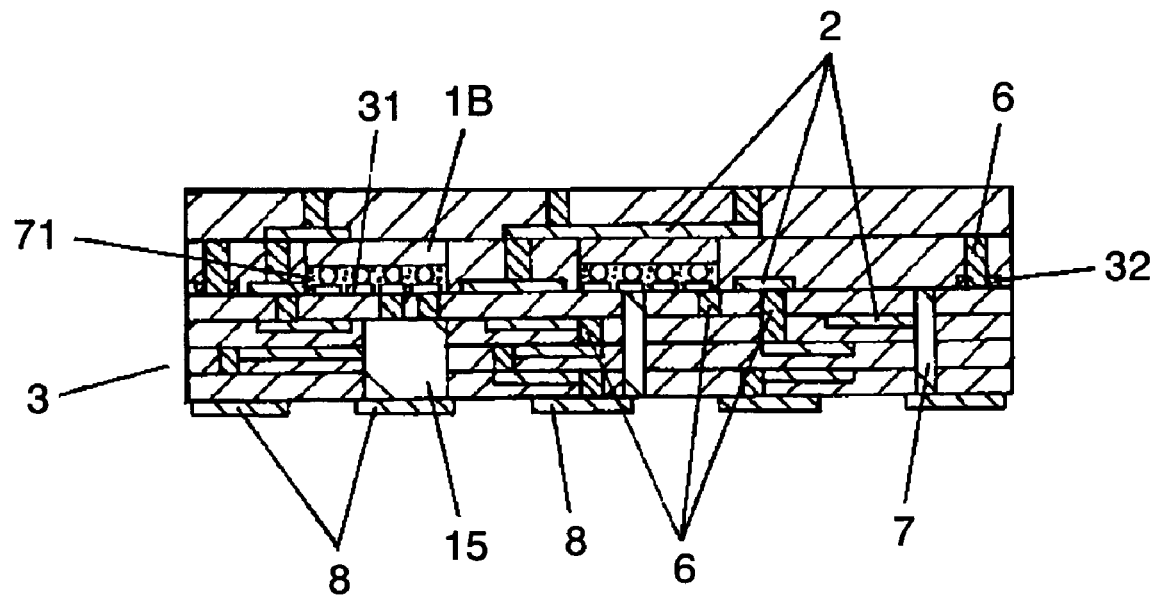
FIG. 18B shows the cross sectional view of the other module component in embodiment 4.

However, the heat generated by heat-generating component 1B mounted in a circuit can be quickly discharged at any desired location of the circuit in accordance with the present invention. This provides a greater designing freedom, and makes the downsizing easier. FIG. 17B shows a module component of high heat-discharging capability having its heat radiation member 15 in junction circuit substrate 5. Another high heat-discharging module component can be configured by disposing heat radiation member 15 in circuit substrate 3, as shown in FIG. 18A and FIG. 18B. Circuit substrate 3 may be formed using a cured resin substrate, a ceramic substrate containing heat-conductive alumina as the main ingredient, a metal substrate, a cured composite resin substrate, etc. In this way, the heat of component 1B, which generates a substantial amount of heat, can be discharged efficiently so that the power supply IC can operate to the full performance.

(FIFTH EXEMPLARY EMBODIMENT)

Figure 19A:
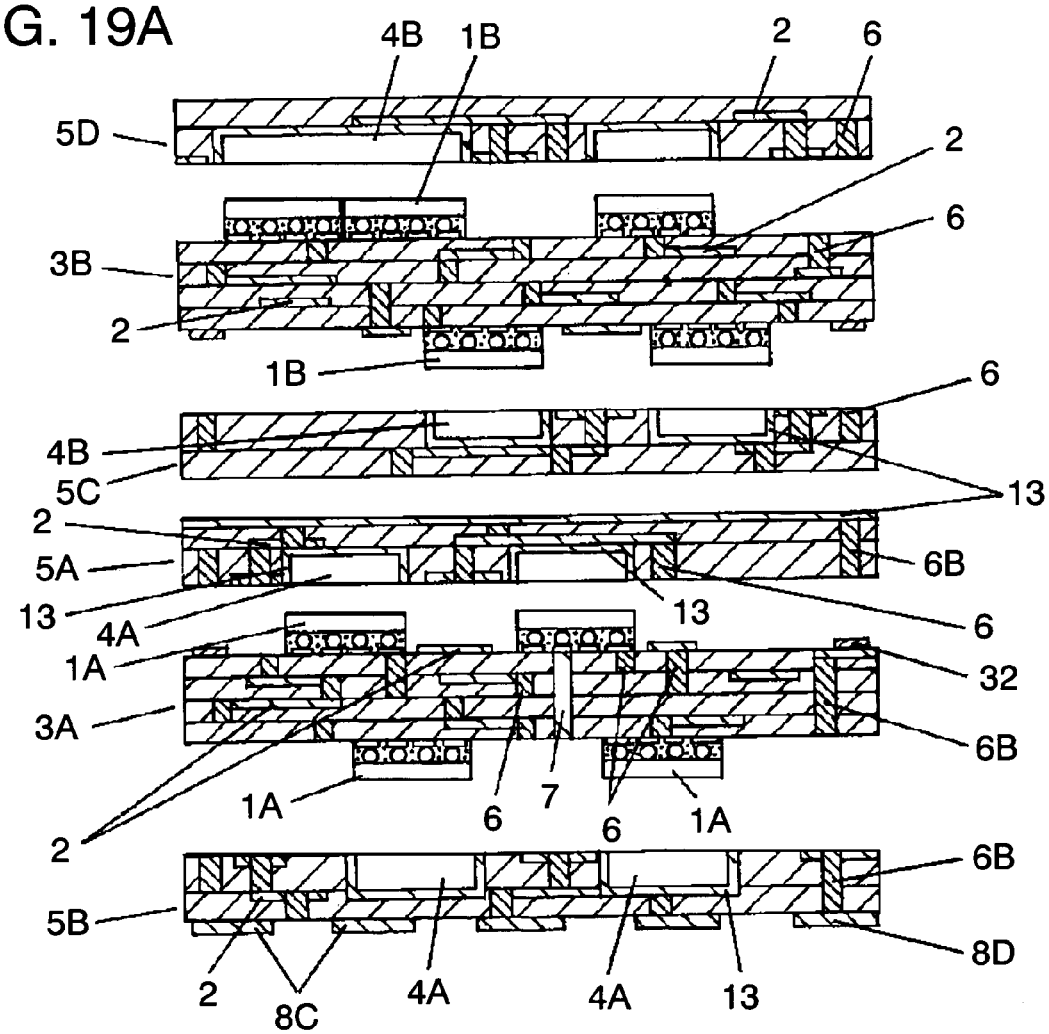
FIG. 19A shows the cross sectional views of other separated module component in accordance with a fifth exemplary embodiment of the present invention.
Figure 19B:
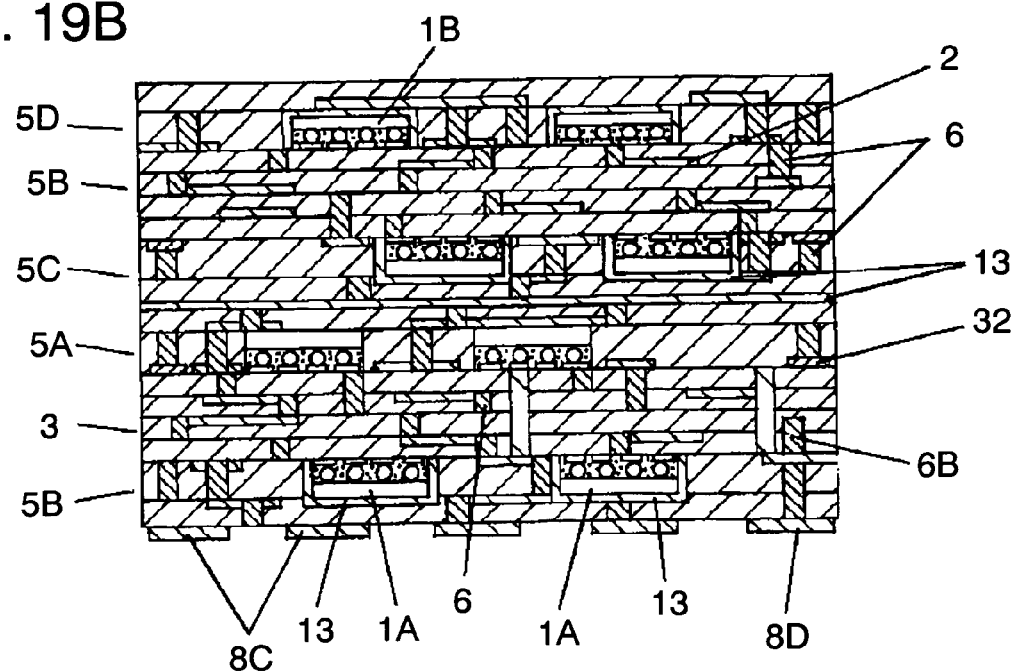
FIG. 19B shows the cross sectional view of the other module component in embodiment 5.

A module component in accordance with embodiment 5 is described referring to FIG. 19A and FIG. 19B. Circuit substrate 3A is provided at the upper and the lower surfaces with components 1A forming a digital circuit. Junction circuit substrate 5A is provided with hollows 4A corresponding to components 1A mounted on the upper surface of circuit substrate 3A. Junction circuit substrate 5A is provided at the upper surface with shield layer 13. Junction circuit substrate 5B is provided with hollows 4A corresponding to components 1A mounted on circuit substrate 3A at the lower surface.

Surface of hollow 4A is provided with shield layer 13.

Junction circuit substrate 5B is proved with connection terminals 8C and 8D for electrical connection with the mother substrate. Connection terminal 8D, among others, is connected with the GND electrode of mother substrate.

Circuit substrate 3B is provided at the upper surface with a plurality of components 1B disposed adjacent to each other, also component 1B at the lower surface. Thus circuit substrate 3B constitutes an analog circuit. Junction circuit substrate 5D is provided with hollow 4B, which hollow corresponding to the plurality of components 1B mounted on the upper surface of circuit substrate 3B.

Junction circuit substrate 5C is provided with hollow 4B, which hollow corresponding to component 1B mounted on the lower surface of circuit substrate 3B.

Hollow 4B is provided on the surface with shield layer 13. Lamination method remains the same as in embodiment 1. A method of forming different kinds of circuits within a module component has already been described in embodiment 3.

For a circuit of larger scale, a plurality of junction circuit substrates and circuit substrates may be used for lamination, as described in the present example.

In this way, the circuit structure can be optimized, and a module component is provided with certain desired electrical characteristics. The present embodiment 5 described an exemplary structure where a circuit substrate sandwiched by junction circuit substrates is combined for two sets. The structure of a module component, however, is not limited to the above-described; there can be a number of variations in the combination of junction circuit substrates and circuit substrates.

The present invention teaches an improved reliability implemented through a higher accuracy in the dimensions, a reduction of damage on substrate which is caused by the shocks given by components when they are mounted, a reduced warp in a laminated substrate which is caused by the difference in the thermal expansion coefficient. Thereby, a compact module component containing components within the inside is offered accompanied by an improved operational reliability. The above-described advantages were not available through conventional structures, where same resin substrates, or same composite resin substrates, are laminated, and the laminated body is cured with heat.

INDUSTRIAL APPLICABILITY

The present invention can implement and offer compact size module components containing within the inside a plurality of components mounted at a high precision level with a high mounting density; These module components exhibit a high reliability in the layer-to-layer connection.

The invention claimed is:

1. A module component comprising
   one or more mounting components,
   a circuit substrate having the components mounted on at least one surface of the circuit substrate, and
   a junction circuit substrate having either a hollow or a hole at the locations corresponding to the components mounted on the at least one surface of the circuit substrate for fitting the mounted components therein, wherein
   the junction circuit substrate includes a via for electrically connecting to a connection terminal on the circuit substrate, the circuit substrate and the junction circuit substrate are laminated and cured into a single body so that the mounted components are contained within the module component.

2. A module component comprising two or more of laminated module components as recited in claim 1, wherein
   a junction surface comprising either a combination of the circuit substrate and the junction circuit substrate, or a combination of the junction circuit substrates.

3. The module component of claim 2, wherein
   the junction circuit substrate located between the circuit substrates comprises on both surfaces a hollow or a hole for fitting the components mounted on the opposing circuit substrates therein.

4. The module component recited in claim 1, wherein the mounted component comprises a heat radiation member.

5. The module component recited in claim 1, wherein the mounted component is located on at least one of the surfaces with a connection terminal.

6. The module component recited in claim 1, wherein the mounted component comprises connection terminals on the two opposite surfaces.

7. The module component recited in claim 1, wherein the mounted component comprises a shielding surface on all of the surfaces with the exception of one surface.

8. The module component recited in claim 1, wherein the circuit substrate comprises at least one item selected from the group consisting of a through hole, via and a wiring pattern.

9. The module component recited in claim 1, wherein the circuit substrate has an average surface roughness equal to or greater than 10 µm.

10. The module component recited in claim 1, wherein the circuit comprises an external connection terminal.

11. The module component of claim 10, wherein the external connection terminal is in either the LGA or a side-face electrode structure.

12. The module component recited in claim 1, wherein the circuit substrate is comprises a material for suppressing the thermal shrinkage of the junction circuit substrate caused during the lamination process for integration.

13. The module component of claim 12, wherein the circuit substrate is made of at least one item selected from the group consisting of cured resin substrate, ceramic substrate, metal substrate and cured composite resin substrate.

14. The module component recited in claim 1, wherein the circuit substrate comprises a heat radiating function.

15. The module component recited in claim 1, wherein the circuit comprises a layer-to-layer shielding function or a partial shielding function.

16. The module component recited in claim 1, wherein the circuit substrate comprises an electric circuit that contains at least one item among the group consisting of an inductor, capacitor, resistor, filter, IC and adjustment circuit.

17. The module component recited in claim 1, wherein the circuit substrate has a multi-layered wiring structure of either the layer-to-layer bond or the layer-to-layer connection.

18. The module component recited in claim 1, wherein the circuit substrate has an anti-solder drift wall in part of connection terminal land.

19. The module component recited in claim 1, wherein the circuit substrate has an area identical to, or larger than, the junction circuit substrate.

20. The module component recited in claim 1, wherein the circuit substrate is a laminated body of different materials.

21. The module component recited in claim 1, wherein the circuit substrate has thermal conductivity.

22. The module component of claim 21, wherein the circuit substrate comprises a heat radiation member.

23. The module component recited in claim 1, wherein the circuit substrate has a thermal expansion coefficient that is substantially identical to that of the junction circuit substrate.

24. The module component recited in claim 1, wherein the circuit substrate is for removing electrical noise.

25. The module component recited in claim 1, wherein the circuit substrate comprises a ground electrode.

26. The module component recited in claim 1, wherein the circuit substrate comprises a wall for alignment.

27. The module component recited in claim 1, wherein at least either one of the circuit substrate and the junction circuit substrate comprises at the junction surface a protrusion, or a hole, for alignment.

28. The module component recited in claim 1, wherein the circuit substrate is for adjusting the constant of electrical characteristic.

29. The module component recited in claim 1, wherein the junction circuit substrate comprises at least one item selected from the group consisting of a through hole, via and a wiring pattern.

30. The module component recited in claim 1, wherein the junction circuit substrate comprises an external connection terminal.

31. The module component of claim 30, wherein the external connection terminal is in either the LGA or a side-face electrode structure.

32. The module component recited in claim 1, wherein the mounted component is press-fit to the hollow, or the hole, of the junction circuit substrate.

33. The module component recited in claim 1, wherein the hollow, or the hole, of the junction circuit substrate has a size which can absorb the dimensional allowance not more than 1% of the mounted component.

34. The module component recited in claim 1, wherein the hollow, or the hole, of the junction circuit substrate has a shape which is larger at the mouth for fitting-in the mounted component than the size in the inside.

35. The module component recited in claim 1, wherein the junction circuit substrate comprises a terminal at the bottom of hollow.

36. The module component recited in claim 1, wherein the junction circuit substrate comprises a terminal at the side wall of hollow, or hole.

37. The module component recited in claim 1, wherein the junction circuit substrate comprises a shield layer in the hollow, or hole.

38. The module component recited in claim 1, wherein the junction circuit substrate comprises a conductive layer in the hollow, or the hole.

39. The module component recited in claim 1, wherein the junction circuit substrate comprises an elastic layer in the hollow, or hole.

40. The module component recited in claim 1, wherein the junction circuit substrate comprises a heat conductive layer in the hollow, or hole.

41. The module component recited in claim 1, wherein the junction circuit substrate is formed of a prepreg.

42. The module component recited in claim 1, wherein the junction circuit substrate comprises an adhesive layer at the surface.

43. The module component of claim 42, wherein the adhesive layer is formed by applying an adhesive agent of either two-liquid type or anaerobic type.

44. The module component of claim 42, wherein the adhesive layer is patterned to have a void at the region corresponding to an area where the circuit substrate and the junction circuit substrate are electrically connected.

45. The module component of claim 44, wherein the region void of adhesive layer is filled with an electro conductive paste.

46. The module component of claim 42, wherein the adhesive layer is formed of an adhesive sheet.

47. The module component of claim 46, wherein the adhesive sheet includes a void hole at the region corresponding to an area where the circuit substrate and the junction circuit substrate are electrically connected.

48. The module component of claim 47, wherein the void hole of adhesive sheet is filled with an electro conductive paste.

49. The module component of claim 46, wherein the adhesive sheet is provided with conductive particles.

50. The module component recited in claim 1, wherein the junction circuit substrate is formed of either a thermosetting resin or a thermoplastic resin.

51. The module component of claim 42, wherein the junction circuit substrate is formed of either a thermosetting resin or a thermoplastic resin.

52. The module component of claim 42, wherein the junction circuit substrate is formed of a material which does not cause a dimensional change when the adhesive layer is cured.

53. The module component of claim 52, wherein the junction circuit substrate is formed of at least one item selected from the group consisting of cured resin substrate, ceramic substrate, metal substrate and cured composite resin substrate.

54. The module component recited in claim 1, wherein the junction circuit substrate is for radiating heat.

55. The module component recited in claim 1, wherein the junction circuit substrate comprises at least either a layer-to-layer shielding function or a partial shielding function.

56. The module component recited in claim 1, wherein the junction circuit substrate comprises an electric circuit which contains at least one item among the group of inductor, capacitor, resistor, filter, IC and adjustment circuit.

57. The module component recited in claim 1, wherein the junction circuit substrate comprises a multi-layered wiring structure of either the layer-to-layer bond or the layer-to-layer connection.

58. The module component recited in claim 1, wherein the junction circuit substrate comprises a connection terminal for connection with the junction circuit substrate.

59. The module component recited in claim 1, wherein the junction circuit substrate comprises an anti-solder drift wall in part of a connection terminal land.

60. The module component recited in claim 1, wherein the junction circuit substrate comprises a laminated body of different materials.

61. The module component recited in claim 1, wherein the junction circuit substrate has thermal conductivity.

62. The module component of claim 61, wherein the junction circuit substrate comprises a heat radiation member.

63. The module component recited in claim 1, wherein the junction circuit substrate is for removing electrical noise.

64. The module component recited in claim 1, wherein the junction circuit substrate comprises a ground electrode.

65. The module component recited in claim 1, wherein a connection terminal of either the circuit substrate or the junction circuit substrate is protruding to the opposite side.

66. The module component recited in claim 1, wherein the portion containing the mounted component has no air gap.

67. The module component recited in claim 1, wherein no air gap exists between the mounted component and the circuit substrate at the mounted surface.

68. The module component of claim 67, wherein an air gap between the mounted component and the circuit substrate at the mounted surface is filled with a resin.

* * * * *

UNITED STATES PATENT AND TRADEMARK OFFICE
CERTIFICATE OF CORRECTION

| | | |
|---|---|---|
| PATENT NO. | : 7,161,371 B2 | Page 1 of 1 |
| APPLICATION NO. | : 10/488552 | |
| DATED | : January 9, 2007 | |
| INVENTOR(S) | : Hiroshi Higashitani et al. | |

It is certified that error appears in the above-identified patent and that said Letters Patent is hereby corrected as shown below:

Column 14, line 54, delete "is" before "comprises."

Signed and Sealed this

Sixth Day of May, 2008

JON W. DUDAS
*Director of the United States Patent and Trademark Office*